United States Patent
Bohr et al.

(10) Patent No.: US 12,266,571 B2
(45) Date of Patent: *Apr. 1, 2025

(54) SELF-ALIGNED CONTACTS

(71) Applicant: Intel Corporation, Santa Clara, CA (US)

(72) Inventors: Mark T. Bohr, Aloha, OR (US); Tahir Ghani, Portland, OR (US); Nadia M. Rahhal-Orabi, Lake Oswego, OR (US); Subhash M. Joshi, Hillsboro, OR (US); Joseph M. Steigerwald, Forest Grove, OR (US); Jason W. Klaus, Portland, OR (US); Jack Hwang, Portland, OR (US); Ryan Mackiewicz, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/374,976

(22) Filed: Sep. 29, 2023

(65) Prior Publication Data

US 2024/0030067 A1 Jan. 25, 2024

Related U.S. Application Data

(60) Continuation of application No. 18/098,029, filed on Jan. 17, 2023, now Pat. No. 11,887,891, which is a
(Continued)

(51) Int. Cl.
*H01L 21/768* (2006.01)
*H01L 21/28* (2006.01)
(Continued)

(52) U.S. Cl.
CPC .. *H01L 21/76897* (2013.01); *H01L 21/28123* (2013.01); *H01L 21/28229* (2013.01);
(Continued)

(58) Field of Classification Search
CPC ........ H01L 21/76897; H01L 21/28123; H01L 21/28229; H01L 21/28255; H01L 21/283;
(Continued)

(56) References Cited

U.S. PATENT DOCUMENTS

| 5,210,435 A | 5/1993 | Roth et al. |
| 5,381,302 A | 1/1995 | Sndhu et al. |

(Continued)

FOREIGN PATENT DOCUMENTS

| DE | 10056272 | 10/2001 |
| JP | H08-008217 A | 1/1996 |

(Continued)

OTHER PUBLICATIONS

U.S. Appl. No. 61/186,954 (Year: 2010).*
(Continued)

*Primary Examiner* — J. E. Schoenholtz
(74) *Attorney, Agent, or Firm* — Schwabe, Williamson & Wyatt P.C.

(57) ABSTRACT

A transistor comprises a substrate, a pair of spacers on the substrate, a gate dielectric layer on the substrate and between the pair of spacers, a gate electrode layer on the gate dielectric layer and between the pair of spacers, an insulating cap layer on the gate electrode layer and between the pair of spacers, and a pair of diffusion regions adjacent to the pair of spacers. The insulating cap layer forms an etch stop structure that is self aligned to the gate and prevents the contact etch from exposing the gate electrode, thereby preventing a short between the gate and contact. The insulator-cap layer enables self-aligned contacts, allowing initial patterning of wider contacts that are more robust to patterning limitations.

16 Claims, 17 Drawing Sheets

Related U.S. Application Data continuation of application No. 17/147,423, filed on Jan. 12, 2021, now Pat. No. 11,600,524, which is a continuation of application No. 16/819,590, filed on Mar. 16, 2020, now Pat. No. 10,930,557, which is a continuation of application No. 16/162,186, filed on Oct. 16, 2018, now Pat. No. 10,629,483, which is a continuation of application No. 15/827,491, filed on Nov. 30, 2017, now Pat. No. 10,141,226, which is a continuation of application No. 15/299,106, filed on Oct. 20, 2016, now Pat. No. 9,892,967, which is a continuation of application No. 14/998,092, filed on Dec. 23, 2015, now Pat. No. 9,508,821, which is a continuation of application No. 14/731,363, filed on Jun. 4, 2015, now Pat. No. 9,466,565, which is a continuation of application No. 14/174,822, filed on Feb. 6, 2014, now Pat. No. 9,054,178, which is a continuation of application No. 13/786,372, filed on Mar. 5, 2013, now Pat. No. 9,093,513, which is a division of application No. 12/655,408, filed on Dec. 30, 2009, now Pat. No. 8,436,404.

(51) Int. Cl.

| | | |
|---|---|---|
| *H01L 21/283* | (2006.01) | |
| *H01L 21/285* | (2006.01) | |
| *H01L 21/311* | (2006.01) | |
| *H01L 23/522* | (2006.01) | |
| *H01L 23/528* | (2006.01) | |
| *H01L 23/535* | (2006.01) | |
| *H01L 29/08* | (2006.01) | |
| *H01L 29/16* | (2006.01) | |
| *H01L 29/423* | (2006.01) | |
| *H01L 29/45* | (2006.01) | |
| *H01L 29/49* | (2006.01) | |
| *H01L 29/51* | (2006.01) | |
| *H01L 29/66* | (2006.01) | |
| *H01L 29/78* | (2006.01) | |

(52) U.S. Cl.
CPC ...... *H01L 21/28255* (2013.01); *H01L 21/283* (2013.01); *H01L 21/28562* (2013.01); *H01L 21/31105* (2013.01); *H01L 21/76802* (2013.01); *H01L 21/76831* (2013.01); *H01L 21/76849* (2013.01); *H01L 21/76877* (2013.01); *H01L 23/5226* (2013.01); *H01L 23/528* (2013.01); *H01L 23/535* (2013.01); *H01L 29/0847* (2013.01); *H01L 29/16* (2013.01); *H01L 29/42364* (2013.01); *H01L 29/456* (2013.01); *H01L 29/4966* (2013.01); *H01L 29/512* (2013.01); *H01L 29/517* (2013.01); *H01L 29/518* (2013.01); *H01L 29/66477* (2013.01); *H01L 29/665* (2013.01); *H01L 29/66545* (2013.01); *H01L 29/6656* (2013.01); *H01L 29/78* (2013.01); *H01L 29/785* (2013.01); *H01L 29/495* (2013.01); *H01L 2029/7858* (2013.01); *H01L 2924/0002* (2013.01)

(58) Field of Classification Search
CPC ......... H01L 21/28562; H01L 21/31105; H01L 21/76802; H01L 21/76831; H01L 21/76849; H01L 21/76877; H01L 23/5226; H01L 23/528; H01L 23/535; H01L 29/0847; H01L 29/16; H01L 29/42364; H01L 29/456; H01L 29/4966; H01L 29/512; H01L 29/517; H01L 29/518; H01L 29/66477; H01L 29/665; H01L 29/66545; H01L 29/6656; H01L 29/78; H01L 29/785; H01L 29/495; H01L 2029/7858; H01L 2924/0002; H01L 21/76834; H01L 21/76885
See application file for complete search history.

(56) References Cited

U.S. PATENT DOCUMENTS

| | | |
|---|---|---|
| 5,385,866 A | 1/1995 | Bartush |
| 5,792,703 A | 8/1998 | Bronner et al. |
| 5,920,098 A | 7/1999 | Liaw |
| 6,030,876 A | 2/2000 | Koike |
| 6,033,963 A | 3/2000 | Huang |
| 6,054,355 A | 4/2000 | Inumiya et al. |
| 6,083,828 A | 7/2000 | Lin et al. |
| 6,310,367 B1 | 1/2001 | Yagishita et al. |
| 6,184,129 B1 | 2/2001 | Huang |
| 6,207,514 B1 | 3/2001 | Furukawa et al. |
| 6,235,593 B1 | 5/2001 | Huang |
| 6,235,627 B1 | 5/2001 | Nakajima |
| 6,265,319 B1 | 7/2001 | Jang |
| 6,294,449 B1 | 9/2001 | Wu et al. |
| 6,306,713 B1 | 10/2001 | Hu et al. |
| 6,348,709 B1 | 2/2002 | Graettinger et al. |
| 6,368,957 B1 | 4/2002 | Horio |
| 6,512,258 B2 | 1/2003 | Maeda |
| 6,544,822 B2 | 4/2003 | Kim et al. |
| 6,607,950 B2 | 8/2003 | Henson |
| 6,613,621 B2 | 9/2003 | Uh et al. |
| 6,774,441 B2 | 8/2004 | Maki et al. |
| 6,797,556 B2 | 9/2004 | Murthy et al. |
| 6,884,715 B1 | 4/2005 | Kwon et al. |
| 6,949,768 B1 | 9/2005 | Anderson et al. |
| 7,026,689 B2 | 4/2006 | Liaw |
| 7,037,774 B1 * | 5/2006 | Syau ................ H01L 21/76816 257/E21.507 |
| 7,053,444 B2 | 5/2006 | Prall |
| 7,074,666 B2 | 7/2006 | Furukawa et al. |
| 7,138,308 B2 | 11/2006 | Cheng et al. |
| 7,148,548 B2 | 12/2006 | Doczy et al. |
| 7,335,589 B2 | 2/2008 | Lee |
| 7,397,095 B2 | 7/2008 | Kim et al. |
| 7,419,898 B2 | 9/2008 | Liaw |
| 7,541,239 B2 | 6/2009 | Curello et al. |
| 7,544,594 B2 | 6/2009 | Change |
| 7,563,701 B2 | 7/2009 | Chang et al. |
| 7,666,727 B2 | 2/2010 | Doyle et al. |
| 7,875,519 B2 | 1/2011 | Rachmady et al. |
| 8,232,607 B2 | 7/2012 | Edge et al. |
| 8,373,239 B2 | 2/2013 | Siddiqui et al. |
| 8,436,404 B2 | 5/2013 | Bohr et al. |
| 8,530,971 B2 | 9/2013 | Cheng |
| 9,054,178 B2 | 6/2015 | Bohr et al. |
| 9,093,513 B2 | 7/2015 | Bohr et al. |
| 9,147,748 B1 | 9/2015 | Xie |
| 9,218,974 B2 * | 12/2015 | Chung ................ H01L 23/485 |
| 9,466,565 B2 | 10/2016 | Bohr et al. |
| 9,508,821 B2 | 11/2016 | Bohr et al. |
| 11,887,891 B2 * | 1/2024 | Bohr ................ H01L 21/76849 |
| 2001/0055842 A1 | 12/2001 | Uh |
| 2002/0001891 A1 | 1/2002 | Kim et al. |
| 2002/0008257 A1 | 1/2002 | Barnak et al. |
| 2002/0058374 A1 | 5/2002 | Kim et al. |
| 2002/0079581 A1 | 6/2002 | Graettinger |
| 2002/0105084 A1 | 8/2002 | Li |
| 2002/0117726 A1 | 8/2002 | Kasuya |
| 2002/0160592 A1 | 10/2002 | Sohn |
| 2002/0192911 A1 | 12/2002 | Parke |
| 2003/0008496 A1 | 1/2003 | Deleonibus |
| 2003/0141554 A1 | 7/2003 | Uehara et al. |
| 2003/0156380 A1 | 8/2003 | Fazan et al. |
| 2003/0235948 A1 | 12/2003 | Park |
| 2005/0045865 A1 | 3/2005 | Wang |
| 2005/0085072 A1 | 4/2005 | Kim |
| 2005/0167763 A1 | 8/2005 | Kuan |
| 2005/0221548 A1 | 10/2005 | Doyle et al. |

(56) References Cited

U.S. PATENT DOCUMENTS

| | | |
|---|---|---|
| 2005/0233527 A1 | 10/2005 | Brask et al. |
| 2006/0065939 A1 | 3/2006 | Doczy |
| 2006/0073699 A1 | 4/2006 | Lee et al. |
| 2006/0076579 A1 | 4/2006 | Thean et al. |
| 2006/0128055 A1 | 6/2006 | Cheng et al. |
| 2006/0175669 A1 | 8/2006 | Kim |
| 2006/0264047 A1 | 11/2006 | Kim |
| 2006/0286755 A1 | 12/2006 | Brask |
| 2006/0289909 A1 | 12/2006 | Gluschenkov et al. |
| 2007/0037336 A1 | 2/2007 | Kwon |
| 2007/0075374 A1 | 4/2007 | Kudou |
| 2007/0104862 A1 | 5/2007 | Lai |
| 2007/0122961 A1 | 5/2007 | Zhu |
| 2007/0141798 A1 | 6/2007 | Bohr |
| 2007/0190763 A1 | 8/2007 | Fujimoto |
| 2007/0241411 A1 | 10/2007 | Yang et al. |
| 2007/0262451 A1 | 11/2007 | Rachmady et al. |
| 2007/0278593 A1 | 12/2007 | Watanabe |
| 2008/0001236 A1 | 1/2008 | Change |
| 2008/0064153 A1 | 3/2008 | Qiang Lo et al. |
| 2008/0087966 A1 | 4/2008 | Tai et al. |
| 2008/0102634 A1 | 5/2008 | Pas |
| 2008/0166841 A1 | 7/2008 | Hsieh |
| 2008/0230917 A1 | 9/2008 | Chou |
| 2008/0272410 A1 | 11/2008 | Lin |
| 2008/0277740 A1 | 11/2008 | Tateshita |
| 2008/0283906 A1 | 11/2008 | Bohr |
| 2009/0017629 A1 | 1/2009 | Jang |
| 2009/0026552 A1 | 1/2009 | Zhang et al. |
| 2009/0057730 A1 | 3/2009 | Furukawa |
| 2009/0085131 A1 | 4/2009 | Matsubara |
| 2009/0095980 A1 | 4/2009 | Yu et al. |
| 2009/0101992 A1 | 4/2009 | Change |
| 2009/0108359 A1 | 4/2009 | Rossi et al. |
| 2009/0130842 A1 | 5/2009 | Hwang |
| 2009/0146296 A1 | 6/2009 | Ye et al. |
| 2009/0149012 A1 | 6/2009 | Brask |
| 2009/0236641 A1 | 9/2009 | Tasaka |
| 2009/0242936 A1 | 10/2009 | Cheng et al. |
| 2009/0275182 A1 | 11/2009 | Chang |
| 2009/0289334 A1* | 11/2009 | Rachmady ............ H01L 29/517 257/E21.24 |
| 2009/0294800 A1 | 12/2009 | Cheng et al. |
| 2009/0311859 A1 | 12/2009 | Bonilla et al. |
| 2010/0140717 A1 | 6/2010 | LaVoie et al. |
| 2010/0148217 A1 | 6/2010 | Simonelli et al. |
| 2010/0155842 A1 | 6/2010 | Anderson et al. |
| 2010/0270627 A1* | 10/2010 | Chang ................ H01L 29/6659 438/692 |
| 2010/0314690 A1* | 12/2010 | Chung .............. H01L 21/28017 257/E27.06 |
| 2011/0108930 A1 | 5/2011 | Cheng |
| 2011/0298017 A1 | 12/2011 | Jain et al. |
| 2012/0135577 A1 | 5/2012 | Lee et al. |
| 2013/0171780 A1 | 7/2013 | Anderson et al. |
| 2013/0178033 A1 | 7/2013 | Bohr et al. |
| 2013/0249020 A1 | 9/2013 | Cheng et al. |
| 2014/0117464 A1 | 5/2014 | Chang et al. |
| 2014/0151817 A1 | 6/2014 | Bohr et al. |
| 2014/0154854 A1* | 6/2014 | Wei ................. H01L 29/66636 438/294 |
| 2014/0179093 A1 | 6/2014 | Choi et al. |
| 2015/0270216 A1 | 9/2015 | Bohr et al. |
| 2016/0155815 A1 | 6/2016 | Bohr et al. |
| 2017/0040218 A1 | 2/2017 | Bohr et al. |
| 2017/0338319 A1 | 11/2017 | Wu |
| 2022/0223422 A1* | 7/2022 | Chou ................ H01L 29/66795 |

FOREIGN PATENT DOCUMENTS

| | | |
|---|---|---|
| JP | 1996172125 | 7/1996 |
| JP | H 08-172125 | 7/1996 |
| JP | 2004-228580 | 4/1997 |
| JP | 1997097880 | 4/1997 |
| JP | H 09-097880 | 4/1997 |
| JP | H10-079492 | 3/1998 |
| JP | H10-144787 A | 5/1998 |
| JP | A-1999074527 | 3/1999 |
| JP | H11-074219 | 3/1999 |
| JP | H11-135745 | 5/1999 |
| JP | 11-307473 | 11/1999 |
| JP | 2000-031291 | 1/2000 |
| JP | A-2000049340 | 2/2000 |
| JP | 2000-223703 | 8/2000 |
| JP | 2001-284467 | 10/2001 |
| JP | 2001-308323 A | 11/2001 |
| JP | 2002-050759 | 2/2002 |
| JP | 2002-110966 | 4/2002 |
| JP | 2002-170821 | 6/2002 |
| JP | 2003-007850 | 1/2003 |
| JP | 2003-523626 | 8/2003 |
| JP | A-2005197748 | 7/2005 |
| JP | 2006-253461 | 9/2006 |
| JP | A-2007220701 | 8/2007 |
| JP | 2008130797 | 6/2008 |
| JP | 2008-153687 | 7/2008 |
| JP | 2008-218962 A | 9/2008 |
| JP | 2009-021598 | 1/2009 |
| JP | 2009-509359 | 3/2009 |
| JP | 2009-158591 | 7/2009 |
| JP | 2009-164612 | 7/2009 |
| JP | 2010010218 | 1/2010 |
| KR | 10-1999-0030576 | 5/1999 |
| KR | 10-2001-0042223 | 5/2001 |
| KR | 10-2002-0052456 | 7/2002 |
| KR | 2002-0058340 | 7/2002 |
| KR | 10-2003-0052812 | 6/2003 |
| KR | 2004-0060335 | 7/2004 |
| KR | 10-2005-0024667 | 3/2005 |
| KR | 10-2007-0004046 | 1/2007 |
| KR | 10-2007-0064346 | 6/2007 |
| KR | 100760926 | 8/2007 |
| KR | 10-2009-0025778 | 3/2009 |
| TW | 200524087 | 7/2005 |
| TW | 200919642 | 5/2009 |
| WO | WO 2006026339 | 3/2006 |
| WO | WO 2006/127846 | 11/2006 |
| WO | WO 2007/038237 | 4/2007 |
| WO | WO 2008-041301 | 4/2008 |
| WO | WO 2009142982 | 11/2009 |
| WO | WO 2011090571 | 7/2011 |

OTHER PUBLICATIONS

Notice of Allowance for European Patent Application No. 16172290. 5, mailed Oct. 2, 2023, 8 pages.

Non-Final Office Action for Chinese Patent Application No. 201080004553.5, dated Mar. 21, 2014, 54 pages.

Non-Final 2nd Office Action for Chinese Patent Application No. 201080054553.5 dated Nov. 18, 2014, 14 pages.

Notice of Allowance for Chinese Patent Application No. 201080054553. 5, mailed Mar. 2, 2015, 4 pgs.

Office Action for Chinese Patent Application No. 201510084707.X, mailed May 4, 2017, 13 pgs.

Office Action for Chinese Patent Application No. 201510084707.X, mailed Dec. 8, 2017, 7 pgs.

Notice of Allowance for Chinese Patent Application No. 201510084707. X, mailed May 8, 2018, 5 pgs.

Extended European Search Report for European Patent Application No. 10844169.2 mailed Aug. 12, 2013, 11 pages.

Non-Final 2nd Office Action for European Patent Application No. 10844169.2, mailed May 12, 2014, 5 pages.

Non-Final 3rd Office Action for European Patent Application No. 10844169.2, mailed Jan. 27, 2015, 6 pages.

Non-Final 4th Office Action for European Patent Application No. 10844169.2, mailed Nov. 24, 2015, 6 pages.

Extended EP Search Report for European Patent Application No. 16172290.5 mailed Oct. 25, 2016, 9 pages.

Official Communication from the European Patent Office for European Patent No 16172290.5-1552 dated Jul. 8, 2016, 4 page.

(56) References Cited

OTHER PUBLICATIONS

Extended European Search Report for European Patent Application No. 17201192.6 mailed Jun. 6, 2018, 9 pgs.
Non-Final Office Action for Japanese Patent Application No. 2012-547095, mailed Nov. 19, 2013, 6 pages.
Notice of Allowance for 2012-547095 Patent Application No. 2012-547095, mailed Apr. 1, 2014, 3 pgs.
Non-Final Office Action for Japanese Patent Application No. 2014-093489, mailed Jan. 6, 2015, 7 pages.
Non-Final Office Action for Japanese Patent Application No. 2014-093489, mailed Jul. 28, 2015, 9 pages.
Non-Final Office Action for Japanese Patent Application No. 2014-093489, mailed Sep. 13, 2016, 9 pages.
Notice of Allowance for Japanese Patent Application No. 2014-093489, mailed Feb. 7, 2017, 34 pgs.
Office Action received for Japanese Application No. 2015232164, mailed Nov. 22, 2016, 7 pages.
Office Action for Japanese Patent Application No. 2015-232164, mailed Aug. 1, 2017, 3 pgs.
Office Action for Japanese Patent Application No. 2015-232164, mailed Oct. 23, 2018, 13 pgs.
Non-Final Office Action for Japanese Patent Application No. 2017-025499, mailed Oct. 24, 2017, 4 pages.
Notice of Allowance for Japanese Patent Application No. 2017-025499, mailed Feb. 6, 2018, 4 pgs.
Office Action from Japanese Patent Application No. 2017-195735 mailed Sep. 4, 2018, 14 pages.
Non-Final Office Action for Korean Patent Application No. 2012-7016899, mailed Jul. 22, 2013, 6 pages.
Non-Final Office Action for Korean Patent Application No. 2012-7016899, mailed Feb. 7, 2014, 4 pages.
Final Office Action for Korean Patent Application No. 2012-7016899, mailed Aug. 8, 2014, 2 pages.
Notice of Allowance for Korean Patent Application No. 10-2012-7016899, mailed Oct. 8, 2014, 4 pgs.
Non-Final Office Action for Korean Patent Application No. 2013-7024989, mailed Oct. 13, 2013, 3 pages.
Final Office Action for Korean Patent Application No. 2013-7024989, mailed Apr. 2, 2014, 3 pages.
Office Action for Korean Patent Application No. 10-2013-7024989, mailed Oct. 27, 2014, 6 pgs.
Notice of Allowance for Korean Patent Application No. 2013-7024989, mailed Jan. 12, 2015, 4 pages.
Non-Final Office Action for Korean Patent Application No. 2013-7033304, mailed Jan. 17, 2014, 10 pages.
Final Office Action for Korean Patent Application No. 2013-7033304, mailed Jul. 16, 2014, 9 pages.
Notice of Allowance for Korean Patent Application No. 10-2013-7033304, mailed Jan. 12, 2015, 4 pgs.
Non-Final Office Action for Korean Patent Application No. 2014-7025871, mailed Nov. 18, 2014, 5 pages.
Final Office Action for Korean Patent Application No. 2014-7025871, mailed May 18, 2015, 6 pages.
Non-Final Office Action for Korean Patent Application No. 2014-7025871, mailed Jul. 7, 2015, 6 pages.
Office Action for Korean Patent Application No. 10-2014-7025871, mailed Nov. 15, 2016, 10 pgs.
Non-Final Office Action for Korean Patent Application No. 2015-7016332, mailed Jul. 13, 2015, 4 pages.
Non-Final Office Action for Korean Patent Application No. 2015-7016332, mailed Jan. 7, 2016, 2 pages.
Office Action for Korean Patent Application No. 10-2015-7016332, mailed Feb. 24, 2016, 4 pgs.
Non-Final Office Action for Korean Patent Application No. 2016-7003449, mailed Mar. 14, 2016, 5 pages.
Notice of Allowance for Korean Patent Application No. 10-2016-7003449, mailed Sep. 6, 2016, 4 pages.
Office Action for Korean Patent Application No. 10-2016-7032674, mailed Jan. 12, 2017, 10 pgs.
Notice of Allowance for Korean Patent Application No. 10-2016-7032674, mailed Jun. 9, 2017, 5 pgs.
Non-Final Office Action for Korean Patent Application No. 2017-7025380, mailed Sep. 19, 2017, 10 pgs.
Final Office Action for Korean Patent Application No. 2017-7025380 mailed Jun. 8, 2018, 5 pgs., with English translation.
Final Office Action and Dismissal of Amendment for Korean Patent Application No. 2017-7025380 mailed Aug. 20, 2018, 8 pgs., with English translation.
Office Action for Korean Patent Application No. 10-2018-7027315, mailed Oct. 13, 2018, 8 pgs.
International Search Report and Written Opinion for International Application No. PCT/US2010/059302 dated Sep. 9, 2011, 9 pages.
International Preliminary Report on Patentability for International Application No. PCT/US2010/059302 dated Jul. 12, 2012, 7 pages.
Non-Final Office Action and Search Report for Taiwan U.S. Appl. No. 99/143,705, mailed Apr. 13, 2015, 19 pages.
Notice of Allowance for Taiwan U.S. Appl. No. 99/143,705, mailed Nov. 25, 2015, 3 pgs.
Notice of Allowance for Taiwan Patent Application No. 104143854, mailed Mar. 16, 2017, 4 pgs.
Office Action for Taiwan Patent Application No. 106112596, mailed Sep. 27, 2017, 3 pgs.
Notice of Allowance for Taiwan Patent Application No. 106112596, mailed Apr. 20, 2018, 3 pgs.
Office Action for Taiwan Patent Application No. 106134564, mailed Mar. 1, 2018, 5 pgs., No translation.
Notice of Allowance for Taiwan Patent Application No. 106134564, mailed Jul. 7, 2018, 3 pgs.
Office Action for Taiwan Patent Application No. 107127791, mailed Dec. 6, 2018, 4 pgs.
Yu, K.C., et al., "Integration Challenges of 0.1 µm CMOS Cu/Low-k Interconnects", Interconnect Technology Conference, 2002, Proceedings of the IEEE 2002 International, 3 pages.
Frarkhanda, Ana, et al., "Gate Workfunction Engineering for Deep Sub-Micron MOSFET's: Motivation, Features and Challenges", International Journal of Electronics and Communication Technology, vol. 2, No. 4, 2011, pp. 29-35.
Hsieh, Y.H., et al., "Process Development of High-k Metal Gate Aluminum CMP at 28nm Technology Node", Sematech Advanced Metallization Conference Oct. 5-8, 2010, Albany NY.
Lin, Kun-Hsien, et al., "Investigation of PVD TiN Process for 28nm Hi-K PMOS Effective Work Function Enhancement", Sematech Advanced Metallization Conference Oct. 5-8, 2010, Albany NY.
Niwa, M., "Development of 32 nm CMOS and recent Trend for Beyond 32 nm", 7th Annual Sematech Symposium, Jun. 22, 2011, Tokyo Japan.
Notice of Allowance from European Patent Application No. 10844169.2, mailed Apr. 12, 2018, 2 pgs.
Office Action from Korean Patent Application No. 10-2018-7036157, mailed Feb. 11, 2019, 10 pgs.
Office Action from Japanese Patent Application No. 2017-195735, mailed May 7, 2019, 7 pgs.
Appeal Decision to Reject Appeal from Japanese Patent Application No. 2015-232164, mailed Apr. 9, 2019, 24 pgs.
Notice of Allowance from Taiwan Patent Application No. 107127791, mailed Apr. 2, 2019, 3 pgs.
Office Action from Japanese Patent Application No. 2017-195735, mailed Apr. 16, 2019, 7 pages.
Search Report for European Patent Application No. 19152329.9, mailed May 8, 2019, 8pgs.
Office Action for Korean Patent Application No. 2019-7016116 mailed Jul. 22, 2019, 9 pgs., with English translation.
Notice of Allowance for Japanese Patent Application No. 2017-195735 mailed Sep. 19, 2019, 3 pages, No translation.
Office Action from Japanese Patent Application No. 2018-220316, mailed Oct. 25, 2019, 10 pages.
Office Action from Korean Patent Application No. 10-2019-7016116, mailed Jan. 7, 2020, 5 pages.
Search for European Patent Application No. 16172290.5, mailed Jan. 14, 2020, 7 pages.
Office Action from European Patent Application No. 17201192.6, mailed Mar. 3, 2020, 7pgs.

(56) References Cited

OTHER PUBLICATIONS

Office Action from European Patent Application No. 19152329.9, Mar. 25, 2020, 4 pgs.

Notice of Allowance From Japanese Patent Application No. 2018-220316, mailed Jul. 2, 2020, 3 pgs.

Office Action From Japanese Patent Application No. 2018-220316, mailed Apr. 28, 2020, 5 pgs.

Office Action From Korean Application No. 10-2020-7013406, mailed Jun. 26, 2020, 8 pgs.

Office Action From Korean Application No. 10-2020-7013406, mailed Nov. 23, 2020, 7 pgs.

Office Action from Korean Patent Application No. 10-2020-7013406, mailed Feb. 18, 2021, 7 pgs.

Notice of Allowance from Korean Patent Application No. 10-2020-7037113, mailed Feb. 15, 2021, 4 pgs.

Office Action from European Patent Application No. 16172290.5, mailed Apr. 12, 2021, 4 pgs.

Notice of Allowance from Korean Patent Application No. 10-2021-7014516, mailed Jun. 9, 2021, 3 pgs.

Office Action from European Patent Application No. 19152329.9, mailed Jul. 23, 2021, 3 pgs.

Notice of Allowance from Korean Patent Application No. 10-2021-7029038, mailed May 9, 2022, 3 pgs.

Chi, R., Work Function and Process Integration Issues of Metal Gate Materials in CMOS Technology, Diss. National University of Singapore, 2006 (Year: 2006).

Bao, Ruqiang, et al. "Replacement Metal Gate Resistance in FinFET Architecture Modelling, Validation and Extendibility." 2015 IEEE International Electron Devices Meeting (IEDM), 2015, doi:10.1109/iedm.2015.7409826.

Search Report from European Patent Application No. 22161202.1, mailed Jun. 7, 2022, 11 pgs.

Office Action for European Patent Application No. 16172290.5, mailed Nov. 7, 2022, 3 pages.

Office Action from European Patent Application No. 19152329.9, mailed Jan. 30, 2023, 6 pgs.

Office Action from European Patent Application No. 22161202.1, mailed Nov. 19, 2024, 4 pgs.

\* cited by examiner

SELF-ALIGNED CONTACTS

CROSS-REFERENCE TO RELATED APPLICATIONS

This application is a continuation of U.S. patent application Ser. No. 18/098,029 filed Jan. 17, 2023, which is a continuation of U.S. patent application Ser. No. 17/147,423 filed Jan. 12, 2021, now U.S. Pat. No. 11,600,524 issued Mar. 7, 2023, which is a continuation of U.S. patent application Ser. No. 16/819,590 filed Mar. 16, 2020, now U.S. Pat. No. 10,930,557 issued Feb. 23, 2021, which is a continuation of Ser. No. 16/162,186 filed Oct. 16, 2018, now U.S. Pat. No. 10,629,483 issued Apr. 21, 2020, which is a continuation of U.S. patent application Ser. No. 15/827,491 filed Nov. 30, 2017, now U.S. Pat. No. 10,141,226 issued Nov. 27, 2018, which is a continuation of U.S. patent application Ser. No. 15/299,106 filed Oct. 20 2016, now U.S. Pat. No. 9,892,967 issued Feb. 13, 2018, which is a continuation of U.S. patent application Ser. No. 14/998,092 filed Dec. 23, 2015, now U.S. Pat. No. 9,508,821 issued Nov. 29, 2016, which is a continuation of U.S. patent application Ser. No. 14/731,363 filed Jun. 4, 2015, now U.S. Pat. No. 9,466,565 issued Oct. 11, 2016, which is a continuation of U.S. patent application Ser. No. 14/174,822 filed Feb. 6, 2014, now U.S. Pat. No. 9,054,178 issued Jun. 9, 2015, which is a continuation of U.S. patent application Ser. No. 13/786,372 filed Mar. 5, 2013, now U.S. Pat. No. 9,093,513 issued Jul. 28, 2015, which is a divisional of U.S. patent application Ser. No. 12/655,408 filed Dec. 30, 2009, now U.S. Pat. No. 8,436,404 issued May 7, 2013. Each of these applications are herein incorporated in their entirety by reference.

BACKGROUND

Metal-oxide-semiconductor (MOS) transistors, such as MOS field effect transistors (MOSFET), are used in the manufacture of integrated circuits. MOS transistors include several components, such as a gate electrode, gate dielectric layer, spacers, and diffusion regions such as source and drain regions. An interlayer dielectric (ILD) is typically formed over the MOS transistor and covers the diffusion regions.

Electrical connections are made to the MOS transistor by way of contact plugs that are typically formed of a metal such as tungsten. The contact plugs are fabricated by first patterning the ILD layer to form vias down to the diffusion regions. The patterning process is generally a photolithography process. Next, metal is deposited in the vias to form the contact plugs. A separate contact plug is formed down to the gate electrode using the same or a similar process.

One problem that can occur during the fabrication of a contact plug is the formation of a contact-to-gate short. A contact-to-gate short is a short circuit that occurs when the contact plug is misaligned and comes into electrical contact with the gate electrode. One conventional approach to preventing contact-to-gate shorts is by controlling registration and critical dimensions (CDs). Unfortunately, for transistors with gate pitches (gate length+space) at or below 100 nanometers (nm), CD control for gate and contact dimensions needs to be less than 10 nm and the registration control between gate and contact layers also needs to be less than 10 nm to deliver a manufacturable process window. Thus, the likelihood of a contact shorting to a gate is very high. This problem becomes more prevalent as transistor gate pitch dimensions are scaled down further because the critical dimensions become much smaller.

DETAILED DESCRIPTION

Described herein are systems and methods of reducing the likelihood of contact-to-gate shorts during the fabrication of metal-oxide-semiconductor (MOS) transistors. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
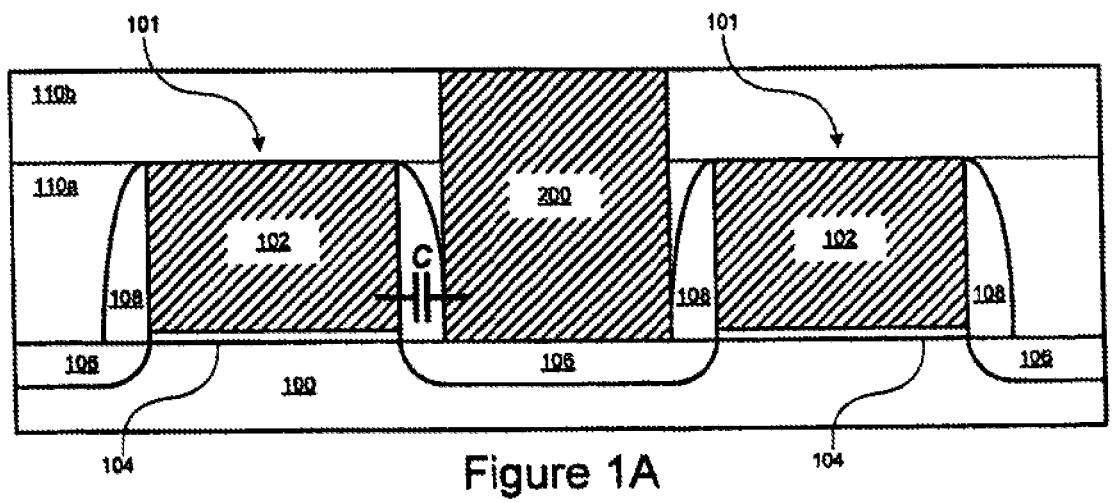
FIG. 1A illustrates a substrate and two conventional MOS transistors with a correctly aligned trench contact.

FIG. 1A illustrates a substrate 100 and two MOS transistors 101. The MOS transistors 101 include gate electrodes 102, gate dielectric layers 104, and spacers 108. Diffusion regions 106 are formed in the substrate 100. Interlayer dielectrics (ILD), such as ILD layers 110a and 110b, are deposited in the regions between and around the two MOS transistors 101.

FIG. 1A also illustrates a trench contact 200 that is formed through the ILD layers 110a/b down to the diffusion region 106. The trench contact 200 is typically formed using a photolithography patterning process followed by a metal deposition process. Photolithography patterning processes and metal deposition processes are well known in the art. The photolithography patterning process etches a trench opening through the ILD layers 110a/b down to the diffusion region 106. The metal deposition process, such as electroplating, electroless plating, chemical vapor deposition, physical vapor deposition, sputtering, or atomic layer deposition, fills the trench opening with a metal such as tungsten or copper. A metal liner is often deposited prior to the metal, such as a tantalum or tantalum nitride liner. A planarization process, such as chemical-mechanical polishing (CMP), is used to remove any excess metal and complete the fabrication of the trench contact 200.

It should be noted that in alternate implementations of the invention, via contacts may be used instead of trench contacts. Thus, the contact opening may be either a trench shape or a via shape, depending on the patterning process used or the needs of a particular integrated circuit process. The implementations of the invention described herein will refer to contact trench openings and trench contacts, but it should be noted that via openings and via contacts (also known as contact plugs or via plugs) can be used instead of contact trench openings and trench contacts in any of these implementations.

As integrated circuit technology advances, transistor gate pitches progressively scale down. This gate pitch scaling has resulted in a number of new, problematic issues, one of which is increased parasitic capacitance (denoted by the "C" in FIG. 1A) caused by relatively tight spacing between the trench contact 200 and the diffusion region 106 on one side and the gate electrode 102 on the other. The spacers 108 tend to provide the bulk of the separation between the trench contact 200/diffusion region 106 and the gate electrodes 102. Conventional spacer materials, such as silicon nitride, do little to reduce this parasitic capacitance. Unfortunately, parasitic capacitance degrades transistor performance and increases chip power.

Another problematic issue caused by gate pitch scaling is the formation of contact-to-gate (CTG) shorts. The fabrication process for the trench contact 200 is designed to prevent the trench contact 200 from coming into physical contact with the metal gate electrode 102. When such contact occurs, a CTG short is created that effectively ruins the MOS transistor. CTG shorts have become a major yield limiter as transistor gate pitches have scaled down below 100 nanometers (nm).

Current methods to reduce CTG shorts include controlling registration and patterning contacts with smaller critical dimensions. However, as gate pitch has scaled down, the registration requirements are becoming very difficult to meet with existing technology. For instance, transistors with gate pitches at or below 100 nm require CD control and layer registration control of less than 10 nm to deliver a manufacturable process window. Thus, the likelihood of a contact shorting to a gate is very high.

Figure 1B:
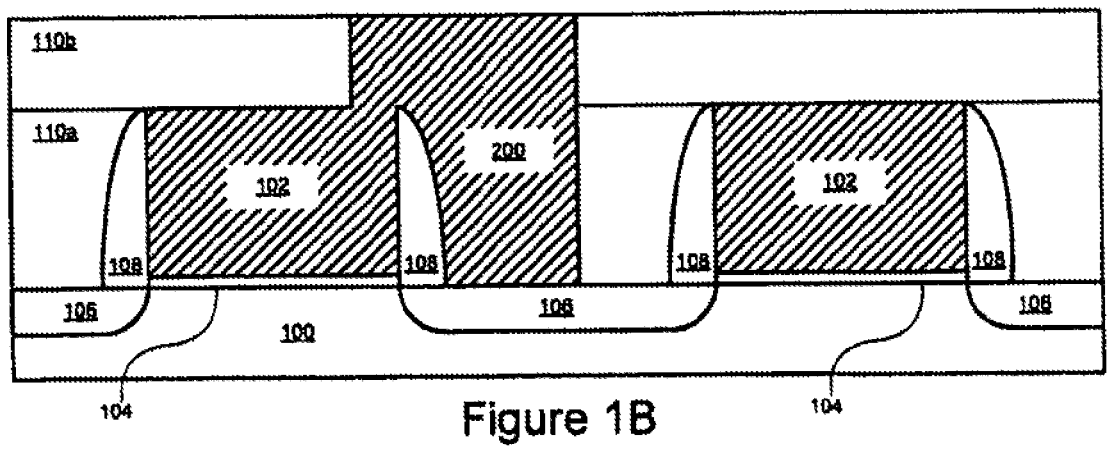
FIG. 1B illustrates a misaligned trench contact formed to a diffusion region of the MOS transistors, resulting in a contact-to-gate short.

FIG. 1B illustrates what happens when the trench contact 200 is misaligned. The same photolithography processes are used, but as shown, the trench contact 200 is formed at a location that is not completely within the area between the two spacers 108. The misalignment causes the trench contact 200 to be in physical contact with one of the gate electrodes 102, thereby creating a contact-to-gate short.

In accordance with implementations of the invention, an insulator-capped gate electrode may be used to minimize the likelihood of contact-to-gate shorts. In one implementation, the insulator-cap layer is formed atop the gate electrode 102 and within the spacers 108 of the MOS transistor 101. In some implementations of the invention, the insulator-cap can consume a significant portion of the volume that exists between the spacers. For instance, the insulator-cap can consume anywhere from 10% to 80% of the volume that exists between the spacers, but will generally consume between 20% and 50% of that volume. The gate electrode and gate dielectric layer consume the majority of the remaining volume. Materials that may be used to form the insulator-cap are described below.

Figure 2A:
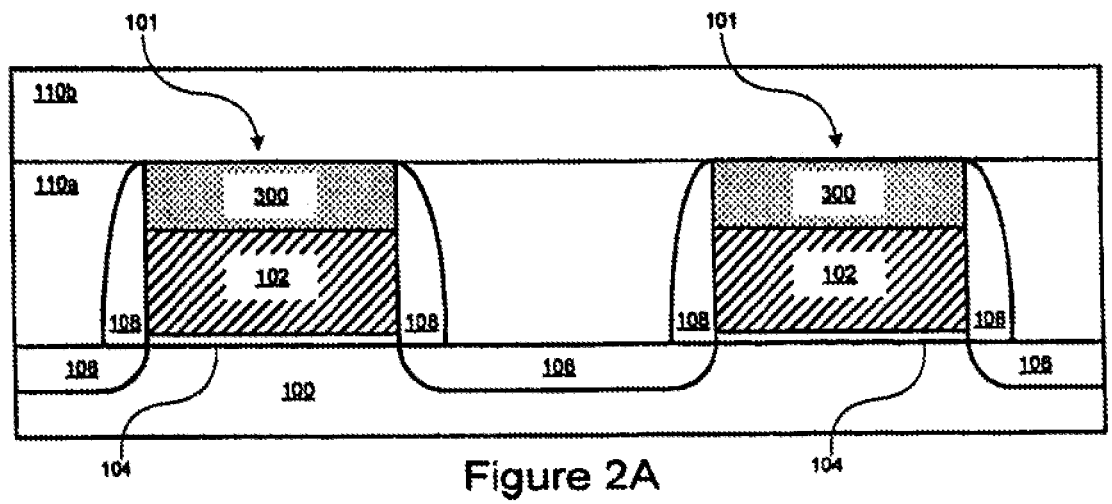
FIG. 2A illustrates a substrate and two MOS transistors having insulator-cap layers atop their respective metal gate electrodes in accordance with one implementation of the invention.

FIG. 2A illustrates an insulator-capped metal gate electrode in accordance with one implementation of the invention. A substrate 100 is shown in FIG. 2A upon which MOS transistors 101 are formed. The substrate 100 may be a crystalline semiconductor substrate formed using a bulk silicon substrate or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, gallium antimonide, or other Group III-V materials. Although a few examples of materials from which the substrate may be formed are described here, any material that may serve as a foundation upon which a semiconductor device may be built falls within the spirit and scope of the present invention.

Each MOS transistor 101 can be a planar transistor, as shown in FIG. 2A, or can be a nonplanar transistor, such as a double-gate or trigate transistor. Although the implementations described herein illustrate planar transistors, the invention is not limited to planar transistors. Implementations of the invention may also be used on nonplanar transistors, including but not limited to FinFET or trigate transistors. Each MOS transistor 101 includes a gate stack formed of three layers: a gate dielectric layer 104, a gate electrode layer 102, and an insulator-cap layer 300. The gate dielectric layer 104 may be formed of a material such as silicon dioxide or a high-k material. Examples of high-k materials that may be used in the gate dielectric layer 104 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, the gate dielectric layer 104 may have a thickness between around 1 Angstrom (Å) and around 50 Å. In further embodiments, additional processing may be performed on the gate dielectric layer 104, such as an annealing process to improve its quality when a high-k material is used.

The gate electrode layer 102 is formed on the gate dielectric layer 104 and may consist of at least a P-type workfunction metal or an N-type workfunction metal, depending on whether the transistor is to be a PMOS or an NMOS transistor. In some implementations, the gate electrode layer 102 may consist of two or more metal layers, where at least one metal layer is a workfunction metal layer and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

The insulator-cap layer 300 is formed on the gate electrode layer 102 and may be formed of materials that include, but are not limited to, silicon nitride, silicon oxide, silicon carbide, silicon nitride doped with carbon, silicon oxynitride, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen. The insulator-cap layer 300 is described in more detail below.

A pair of spacers 108 brackets the gate stack. The spacers 108 may be formed from a material such as silicon nitride, silicon oxide, silicon carbide, silicon nitride doped with carbon, and silicon oxynitride. Processes for forming spacers are well known in the art and generally include deposition and etching process steps.

Diffusion regions 106 are formed within the substrate 100 adjacent to the gate stacks of the MOS transistors 101. For each MOS transistor 101, one adjacent diffusion region 106 functions as a source region and the other adjacent diffusion region 106 functions as a drain region.

The diffusion region 106 may be formed using methods or processes that are well known in the art. In one implementation, dopants such as boron, aluminum, antimony, phosphorous, or arsenic may be implanted into the substrate 100 to form the diffusion regions 106. In another implementation, the substrate 100 may first be etched to form recesses at the locations of the diffusion regions 106. An epitaxial deposition process may then be carried out to fill the recesses with a silicon alloy such as silicon germanium or silicon carbide, thereby forming the diffusion regions 106. In some implementations the epitaxially deposited silicon alloy may be doped in situ with dopants such as boron, arsenic, or phosphorous. In further implementations, alternate materials may be deposited into the recesses to form the diffusion regions 106.

One or more ILD layers 110*a/b* are deposited over the MOS transistors 101. The ILD layers 110*a/b* may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers 110*a/b* may include pores or other voids to further reduce their dielectric constant.

Fabrication of a trench contact 200, also referred to as contact patterning, involves at least a photolithography process and an etching process. The photolithography process forms a photoresist hard mask that defines the location of the trench contact 200. The process begins by depositing a photoresist material on the ILD layer 110*b*. The deposited photoresist layer is exposed to ultraviolet radiation through a patterned optical mask, wherein the pattern defines the trench contact 200. The photoresist layer is then developed to create a photoresist hard mask layer that includes an opening where the trench contact 200 is to be formed. It should be noted that photolithography processes are well known in the art and this description is simply a brief overview of a typical photolithography process. Many intermediate steps, such as baking and alignment steps, have been omitted.

Once the photoresist hard mask is in place defining the trench contact 200, an etching process is carried out. The etchant etches portions of the ILD layer 110*a/b* that are left exposed by openings in the photoresist hard mask, such as the opening for the trench contact 200. The etchant therefore etches a trench opening down to the diffusion region 106. The etching process used may be a conventional chemical wet etch process or a plasma dry etch process. The etching process is carried out for a duration of time, denoted as $T_{ETCH}$, that is sufficient to etch the ILD layer 110 all the way down to the diffusion region 106. The etched trench opening is then filled with one or more metals, as described above, to form the trench contact 200.

In accordance with implementations of the invention, the insulator-cap layer 300 has a thickness that is sufficient to protect the metal gate electrode 102 from being exposed during fabrication of the trench contact 200 should the contact trench opening be aligned over the insulator-cap layer. Furthermore, the insulator-cap layer 300 has a thickness that is sufficient to electrically isolate the metal gate electrode 102 from the trench contact 200 after the trench contact 200 is formed. In one implementation of the invention, this thickness can range from 5 nm to 50 nm. In another implementation, the height of the insulator-cap layer can account for 20% to 80% of the overall height of the gate stack. The etching process used to form the contact trench opening is selective to the insulator-cap layer 300. This means the wet or dry etch chemistry will etch the material of the ILD layer 110*a/b* but will selectively stop and self align to the insulator-cap layer 300 and the sidewall spacers 108.

In accordance with implementations of the invention, the insulator-cap layer 300 also has a thickness that is sufficient to withstand the etching process for the entirety of $T_{ETCH}$ without exposing the underlying metal gate electrode 102. Stated differently, the insulator-cap layer 300 has an initial thickness sufficient to withstand the etching process for a duration of time needed to etch the ILD layer 110*a/b* all the way down to the diffusion region 106 without any portion of the insulator-cap layer 300 being reduced to a thickness that would permit electrical conductivity between the metal gate electrode 102 and the subsequently formed trench contact 200. After the etching process, the combination of the insulator-cap layer 300 and the spacers 108 electrically isolates the metal gate electrode 102 from the trench contact 200, thereby eliminating CTG shorts.

There are several different ways to form the insulator-cap layer 300 of the invention. In one implementation of the invention, where the gate electrode 102 is formed using a gate-first process, a blanket dielectric layer is initially deposited on a substrate. Next, a blanket electrode layer is deposited atop the dielectric layer. Finally, a blanket insulator layer is formed atop the electrode layer. The deposition processes that are used to deposit the dielectric layer, the electrode layer, and the insulator layer are well known in the art and may include, but are not limited to, processes such as electroplating, electroless plating, chemical vapor deposition, atomic layer deposition, physical vapor deposition, and sputtering. The three layers are then etched using conventional patterning processes, such as photolithography processes, to form a gate stack consisting of a gate dielectric layer 104, a gate electrode layer 102, and an insulator-cap layer 300. Spacers 108 and diffusion regions 106 are then formed on opposing sides of the gate stack. An ILD layer 110a is deposited over the gate stack, the spacers 108, and the diffusion region 110. A trench contact 200 may then be formed as described above.

In an alternate implementation of a gate-first process, a blanket dielectric layer and a blanket electrode layer may be deposited and patterned to form a gate stack that consists of the gate dielectric layer 104 and the gate electrode 102. A pair of spacers 108 and diffusion regions 106 may be formed on either side of the gate stack. Next, an etching process may be carried out to recess the metal gate electrode 102 within the spacers 108, thereby reducing the thickness of the metal gate electrode 102. The recessing of the metal gate electrode 102 results in the formation of a trench between the spacers 108 where the bottom surface of the trench corresponds to the top surface of the recessed metal gate electrode 102. The metal etch process is followed by an insulator material deposition process that deposits a blanket layer of insulator material and fills the trench between the spacers 108. A polishing process, such as a chemical mechanical planarization process, is used to polish down the insulator material layer and substantially remove any insulator material that is outside of the spacers 108. The removal of this excess insulator material yields an insulator-cap layer 300 that is substantially contained within the spacers 108.

In another implementation of the invention, a gate-last process, such as a replacement metal gate process, is used to form the gate electrode. In this implementation, a blanket dielectric layer and a blanket dummy electrode layer may be initially deposited and patterned to form a gate stack that consists of the gate dielectric layer 104 and a dummy gate electrode (not shown). It should be noted that the term "dummy" is used to indicate that this layer is sacrificial in nature. The materials used in dummy layers may or may not be the same materials that are used in non-dummy layers. For instance, the dummy electrode layer may consist of polysilicon, which is used in real gate electrodes. A pair of spacers 108 and diffusion regions 106 may be formed on either side of the gate stack. Next, the dummy gate electrode may be etched out to form a trench between the spacers 108 and atop the gate dielectric layer 104. An electrode metal layer may then be deposited to fill the trench. The electrode metal layer may be polished down to remove metal outside of the spacers 108 and to confine the electrode metal to the trench between the spacers 108, thereby forming a metal gate electrode 102.

As described above, an etching process is carried out to recess the metal gate electrode 102 within the spacers 108. The recessing of the metal gate electrode 102 results in the formation of a trench between the spacers 108. An insulator material deposition process fills the trench and a polishing process is used to polish down the insulator material layer and substantially remove any insulator material that is outside of the spacers 108. This yields an insulator-cap layer 300 that is substantially contained within the spacers 108.

Figure 2B:
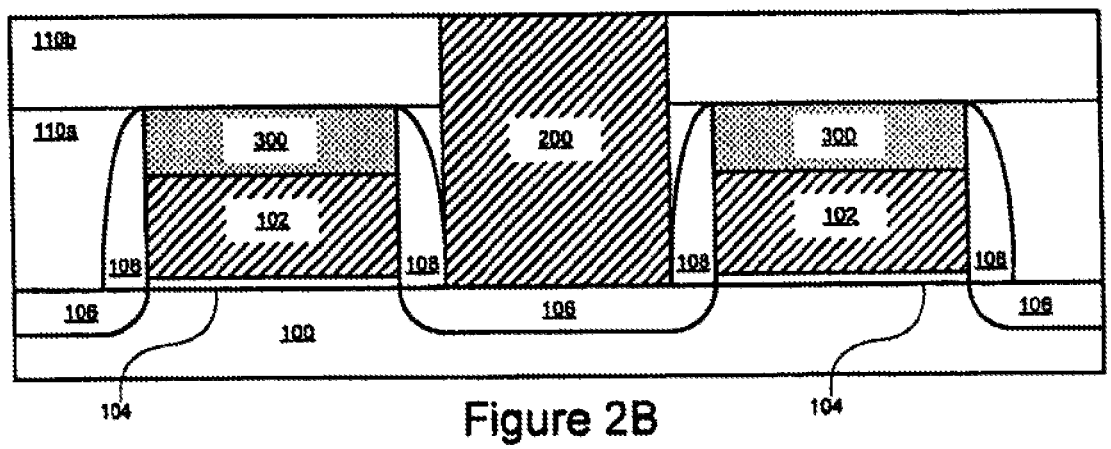
FIG. 2B illustrates a correctly aligned trench contact formed between two MOS transistors of the invention having insulator-cap layers.

FIG. 2B illustrates a trench contact 200 that is correctly aligned between two MOS transistors having insulator-cap layers 300. In this instance the insulator-cap 300 is not used.

Figure 2C:
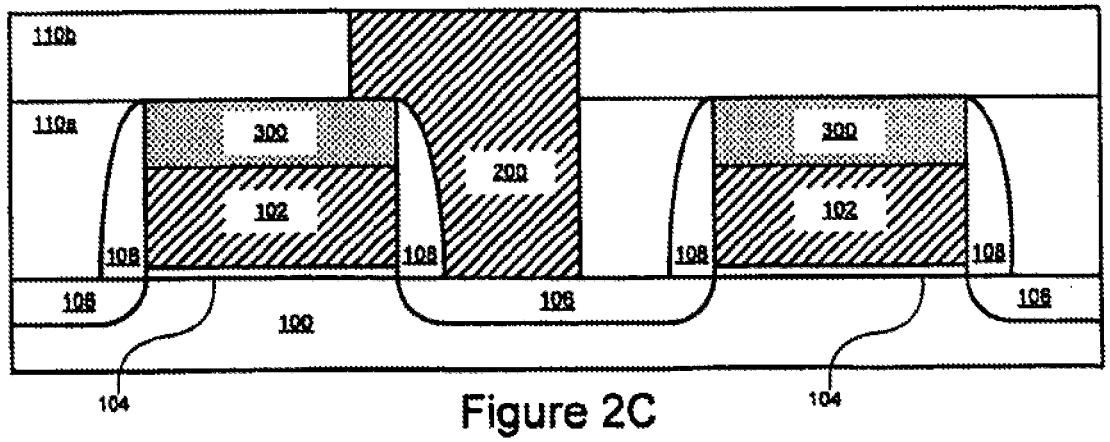
FIG. 2C illustrates a misaligned trench contact formed between two MOS transistors of the invention having insulator-cap layers, where the misalignment does not result in a contact-to-gate short.

FIG. 2C illustrates a misaligned trench contact 200 formed between two MOS transistors having insulator-cap layers 300. As shown, a portion of the misaligned trench contact 200 is situated directly over the gate electrode 102. Unlike the prior art transistors shown in FIG. 1B, however, a CTG short is avoided due to the use of the insulator-cap layer 300. The insulator-cap layer 300 electrically isolates the metal gate electrode 102 from the misaligned trench contact 200, allowing the trench contact 200 to be "self-aligned".

Figure 3A:
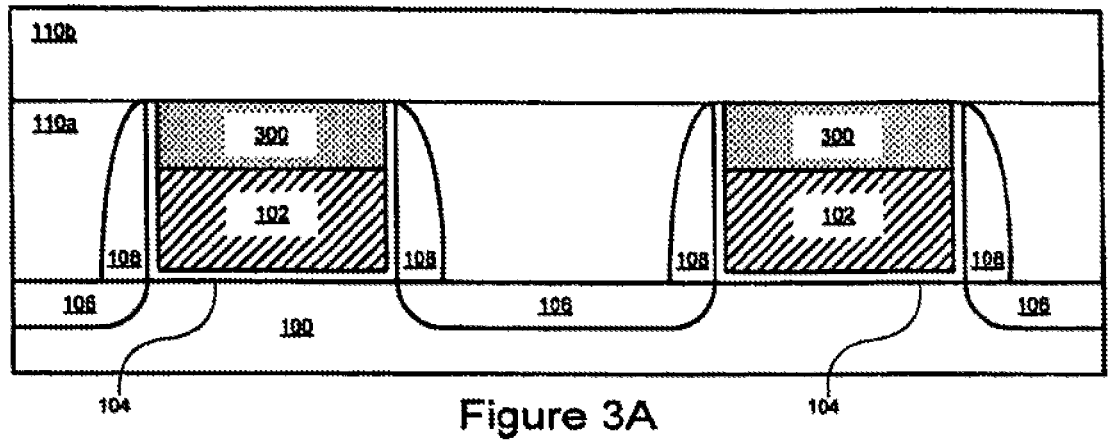
FIGS. 3A to 3C illustrate an insulator-cap layer formed after a replacement metal gate process, in accordance with an implementation of the invention.
Figure 3B:
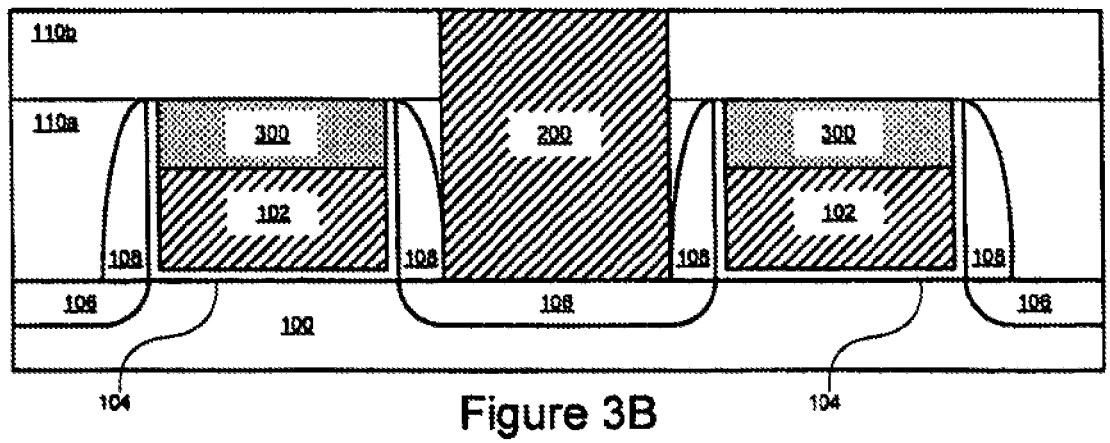
Figure 3C:
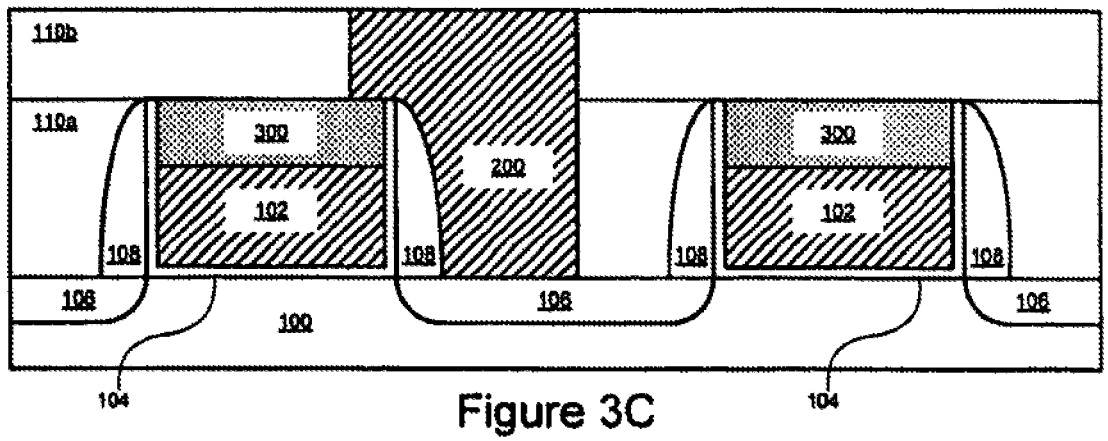

FIGS. 3A to 3C illustrate a slight variation on the transistors of FIG. 2A. In FIG. 3A, a different implementation of a replacement metal gate process is used to form the transistors. In this implementation, a blanket dummy dielectric layer and a blanket dummy electrode layer are deposited on a substrate. Here, the dummy electrode layer may consist of polysilicon and the dummy dielectric layer may consist of silicon dioxide, both of which are used in real gate electrodes and real gate dielectric layers. These two dummy layers are etched to form a gate stack that consists of a dummy gate dielectric layer and a dummy gate electrode layer. Spacers 108 and diffusion regions 106 are then formed on opposing sides of the gate stack. An ILD layer 110a is deposited over the gate stack, spacers 108, and diffusion regions 106. The ILD layer 110a is planarized to expose the dummy electrode layer.

Next, the dummy electrode layer and the dummy gate dielectric layer are removed using one or more etching processes. The removal of the dummy layers produces a trench between the spacers 108. The substrate 100 forms a bottom surface of the trench. A new high-k gate dielectric layer 104 is deposited into the trench using a chemical vapor deposition process or an atomic layer deposition process. The high-k gate dielectric layer 104 is deposited along the bottom and sidewalls of the trench, thereby forming a "U" shaped gate dielectric layer 104, as shown in FIG. 3A. Next, a metal gate electrode layer 102 is deposited atop the high-k gate dielectric layer 104. Processes for forming the metal gate electrode 102 are well known in the art.

In accordance with implementations of the invention, the final metal gate electrode 102 does not fill the trench in its entirety. In one implementation, the metal gate electrode 102 may initially fill the trench in its entirety, but a subsequent etching process may be used to recess the metal gate electrode 102. In another implementation, the metal gate electrode deposition process only partially fills the trench with the metal gate electrode 102. In both implementations, a trench remains above the final metal gate electrode 102 between the spacers 108.

Finally, an insulator material deposition process is used to deposit a blanket layer of insulator material that fills the trench between the spacers 108. A polishing process, such as a chemical mechanical planarization process, is then used to polish down the insulator material layer and remove substantially any insulator material that is outside of the spacers 108. The removal of this excess insulator yields an insulator-cap layer 300 that is substantially confined within the spacers 108. As shown in FIG. 3A, the insulator-cap 300 is also confined within the sidewall portions of the gate dielectric layer 104.

FIG. 3B illustrates a trench contact 200 that is correctly aligned between two MOS transistors having insulator-cap layers 300. FIG. 3C illustrates a misaligned trench contact 200 formed between two MOS transistors having insulator-cap layers 300. Again, a portion of the misaligned trench contact 200 is situated directly over the gate electrode 102. A CTG short is avoided due to the use of the insulator-cap layer 300, which electrically isolates the metal gate electrode 102 from the misaligned trench contact 200.

Figure 4A:
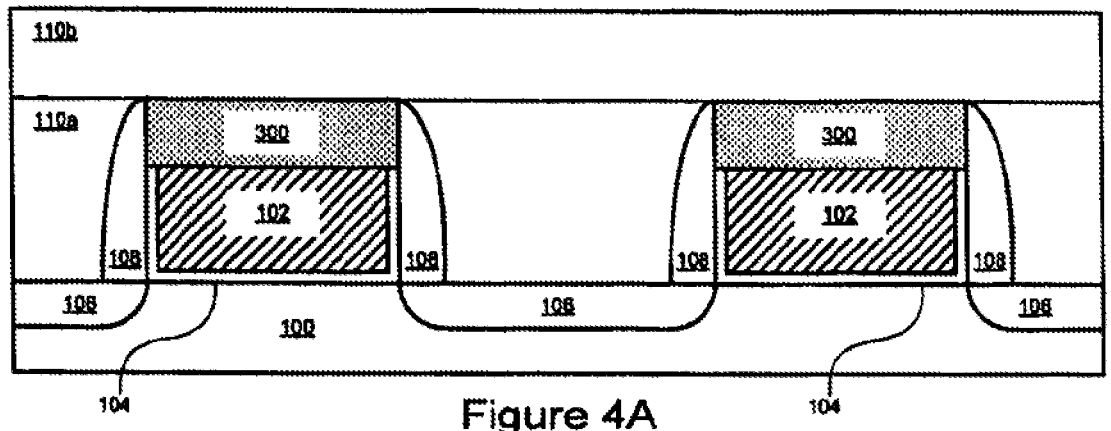
FIGS. 4A to 4C illustrate an insulator-cap layer formed after a replacement metal gate process, in accordance with another implementation of the invention.
Figure 4B:
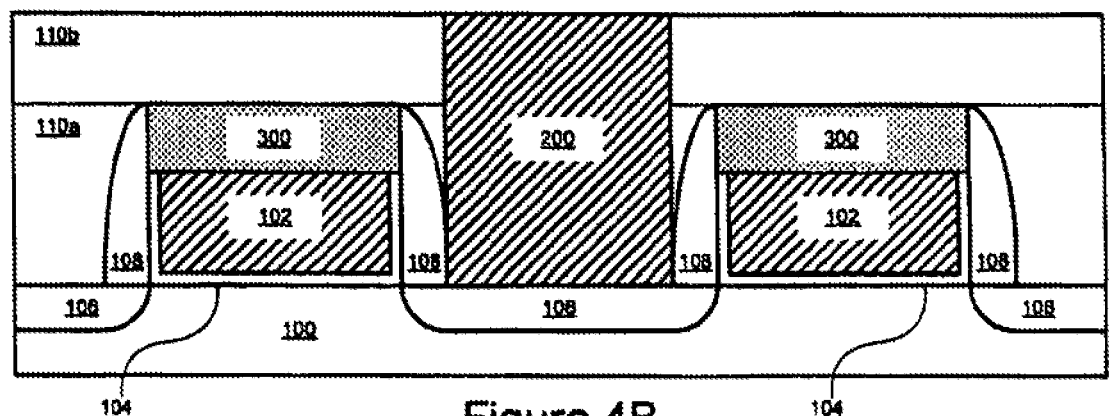
Figure 4C:
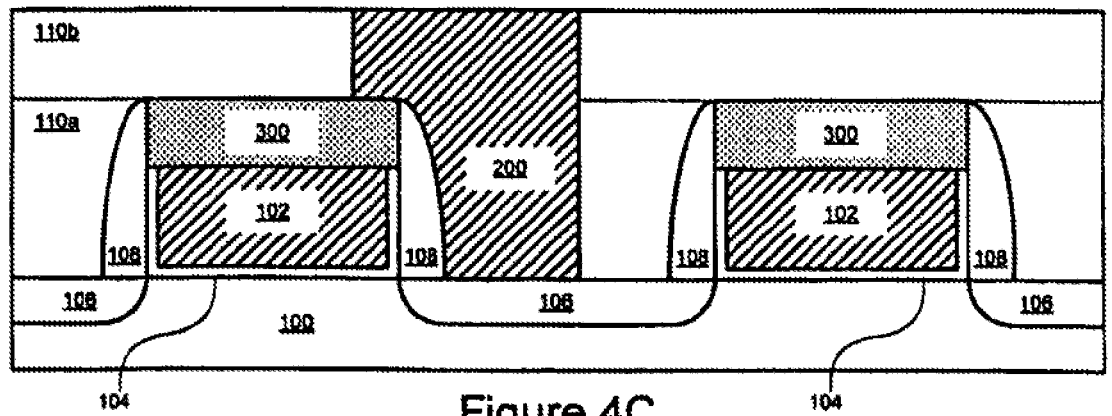

FIGS. 4A to 4C illustrate a slight variation on the transistors of FIG. 3A. In FIG. 4A, a replacement gate process is used again to form transistors having a "U" shaped gate dielectric layer 104. The gate electrode layer 102 and the gate dielectric layer 104 are initially formed using the same processes detailed above for FIG. 3A. Unlike FIG. 3A, in this implementation, both the "U" shaped gate dielectric layer 104 and the metal gate electrode 102 are recessed prior to fabrication of the insulator-cap layer 300. One or more etching processes may be used to recess both structures. The insulator-cap 300 is then formed using the same process described above for FIG. 3A and is situated atop both the gate electrode 102 and portions of the gate dielectric layer 104, as shown in FIG. 4A. FIG. 4B illustrates a trench contact 200 that is correctly aligned between two MOS transistors having insulator-cap layers 300. FIG. 4C illustrates a misaligned trench contact 200 formed between two MOS transistors having insulator-cap layers 300. Again, a portion of the misaligned trench contact 200 is situated directly over the gate electrode 102. A CTG short is avoided due to the use of the insulator-cap layer 300, which electrically isolates the metal gate electrode 102 from the misaligned trench contact 200.

Figure 5A:
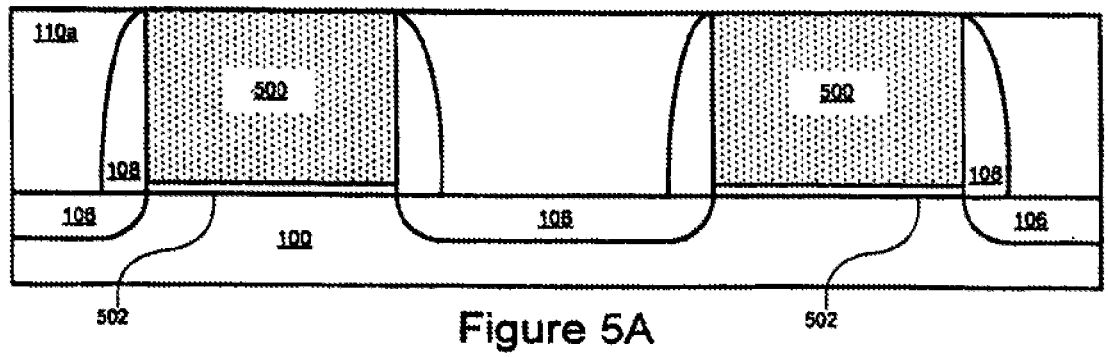
FIGS. 5A to 5I illustrate a fabrication process for an insulator-cap layer that extends over the spacers of a MOS transistor, in accordance with an implementation of the invention.

FIGS. 5A to 5F illustrate the fabrication of an alternate insulator-cap layer that may be used with a MOS transistor. Initially, FIG. 5A illustrates two MOS transistors that include a dummy gate electrode 500 and a dummy gate dielectric layer 502. Also shown are a pair of spacers 108 that are generally formed of silicon nitride.

Figure 5B:
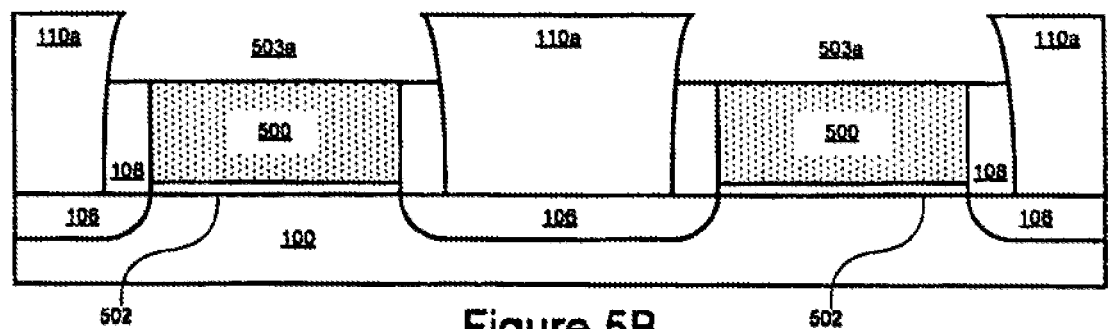

In accordance with implementations of the invention, one or multiple etching processes are carried out to partially recess both the dummy gate electrode layer 500 and the spacers 108. This dual recess is shown in FIG. 5B. The etch chemistry used to recess the dummy gate electrode 500 may differ from the etch chemistry used to recess the spacers 108. The etching processes used may be wet etches, dry etches, or a combination. When the dummy gate electrode 500 and the spacers 108 have been recessed, a trench 503a is formed within the ILD layer 110a where the top surfaces of the dummy gate electrode 500 and the spacers 108 form the bottom of the trench.

Figure 5C:
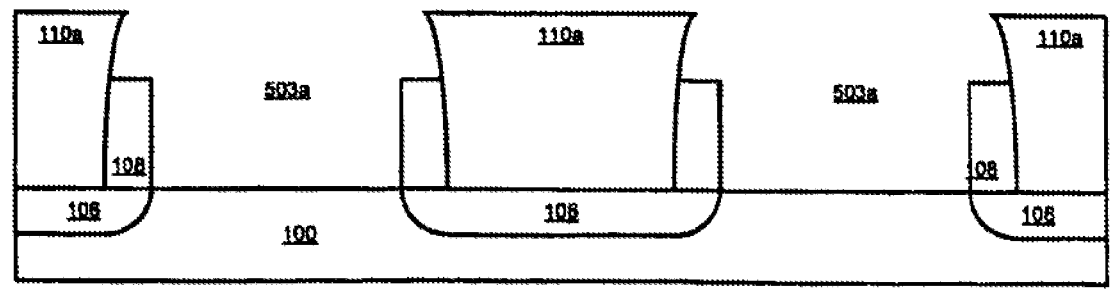

Moving to FIG. 5C, one or more etching processes are carried out to completely remove the dummy gate electrode 500 as well as the dummy gate dielectric 502. Etching processes to completely remove the dummy gate electrode 500 and dummy gate dielectric are well known in the art. Again, these etches may be wet, dry, or a combination. As shown in FIG. 5C, the trench 503a is now much deeper and has a cross-section profile that is relatively wide at the top of the trench 503a and relatively narrow at the bottom of the trench 503a. The dummy gate electrode 500 and dummy gate dielectric 502 are removed in their entirety, thereby exposing the top of the substrate 100.

Figure 5D:
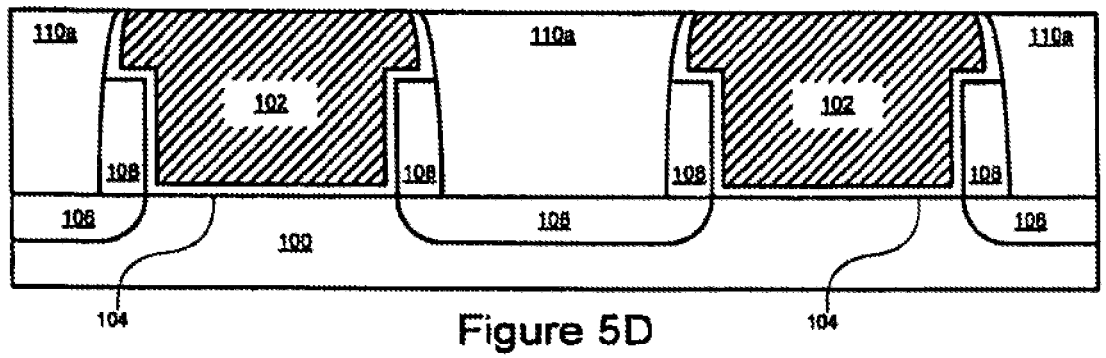

In FIG. 5D, a gate dielectric layer 104 and a metal gate electrode layer 102 are deposited in the trench 503a. A conformal deposition process, such as a CVD or an ALD process, is generally used for the deposition of the gate dielectric layer 104, resulting in a conformal dielectric layer 104 that covers the sidewalls and bottom surface of the trench 503a. The metal gate electrode layer 102 fills the remainder of the trench 503a. In some implementations of the invention, the metal gate electrode layer 102 may consist of two or more layers of metal, for instance, a work function metal layer and a fill metal layer.

In a replacement metal gate process flow, it is very challenging to fill narrow gate trenches with metal gate materials, particularly with transistors having gate widths at or below 22 nm. The process flow described here in FIGS. 5A to 5D enhances the intrinsic fill characteristics by widening the trench openings at the top without affecting the narrow trench widths at the bottom. Thus, the cross-section profile of the trench 503a, with its relatively wide opening at the top, results in an improved metal gate electrode deposition with fewer voids or other defects.

Figure 5E:
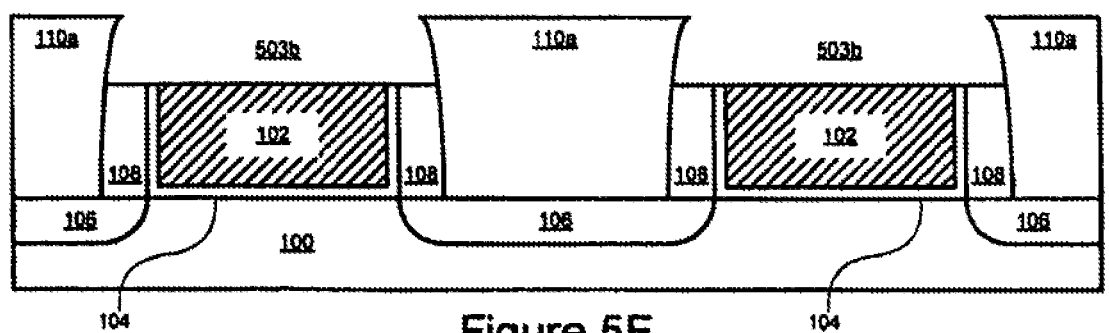

Next, the metal gate electrode layer 102 and the gate dielectric layer 104 are recessed as shown in FIG. 5E, forming a trench 503b. Again, one or more etching processes, either wet or dry, may be used to recess both the gate electrode layer 102 and the gate dielectric layer 104. The etch processes used must be selective to the ILD layer 110a. The metal gate electrode 102 is recessed until its top surface is even with or below the top surfaces of the spacers 108. Although portions of the metal gate electrode 102 are on top of the spacers 108 in FIG. 5D, it is important that no portion of the metal gate electrode 102 remain above the top of the spacers 108 after the recessing of the metal gate 102 in FIG. 5E. This is because any portion of the metal gate electrode 102 that remains atop the spacers 108 may end up forming a CTG short with a misaligned trench contact.

Figure 5F:
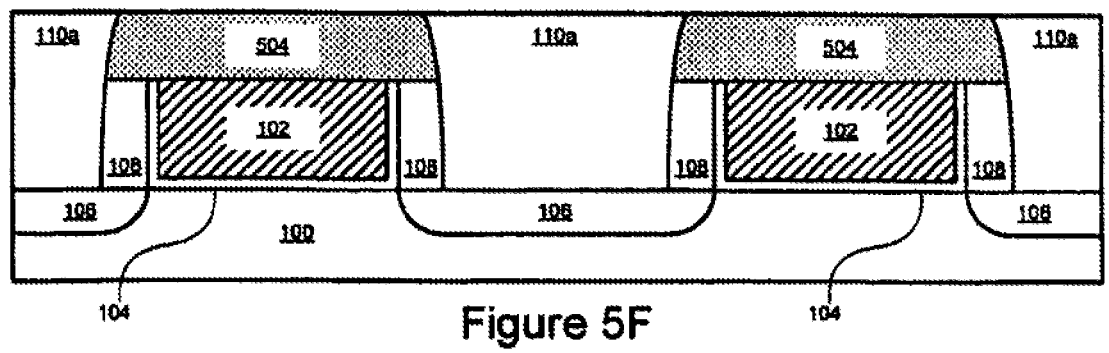

Moving to FIG. 5F, an insulator material deposition process fills the trench 503b and a polishing process is used to polish down the insulator material layer and substantially remove any insulator material that is outside of the trench 503b. This yields an insulator-cap layer 504 that is substantially contained within the trench 503b. The insulator-cap layer 504 has the appearance of a mushroom top as it extends laterally above the spacers 108. The insulator-cap layer 504 improves contact-to-gate margin by extending over the gate spacer 108. The insulator-cap layer 504 may be formed of materials that include, but are not limited to, silicon nitride, silicon oxide, silicon carbide, silicon nitride doped with carbon, silicon oxynitride, other nitride materials, other carbide materials, aluminum oxide, other oxide materials, other metal oxides, and low-k dielectric materials.

Figure 5G:
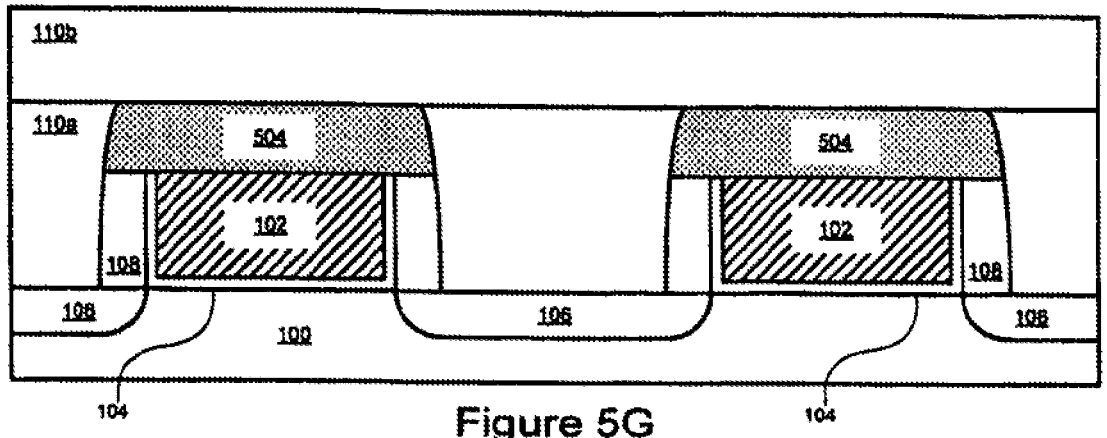
Figure 5H:
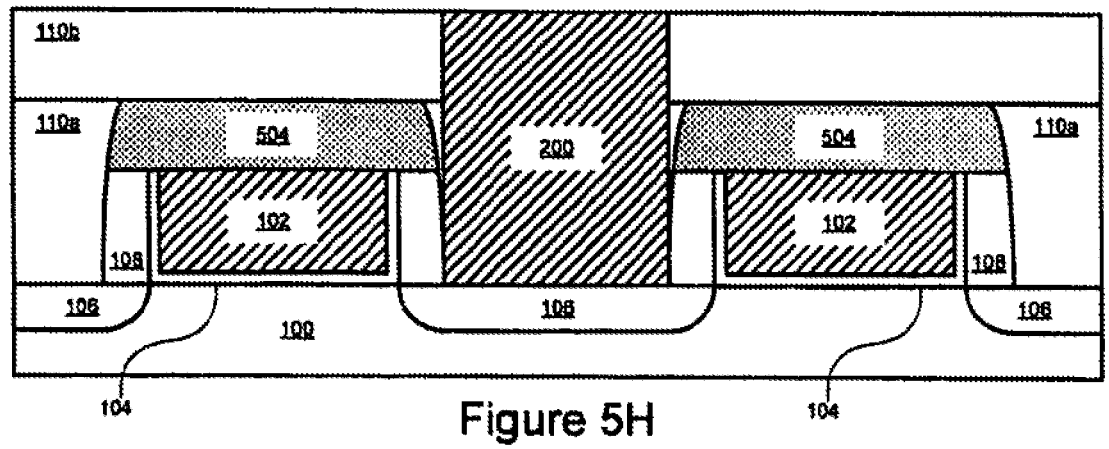

FIG. 5G illustrates the deposition of an additional ILD layer 110b that covers the insulator-cap layers 504 and sits atop the first ILD layer 110a. FIG. 5H illustrates a trench contact 200 that has been fabricated down to the diffusion region 106 through the ILD layers 110a and 110b. The trench contact 200 of FIG. 5H has been correctly aligned between the spacers 108 of adjacent transistors.

Figure 5I:
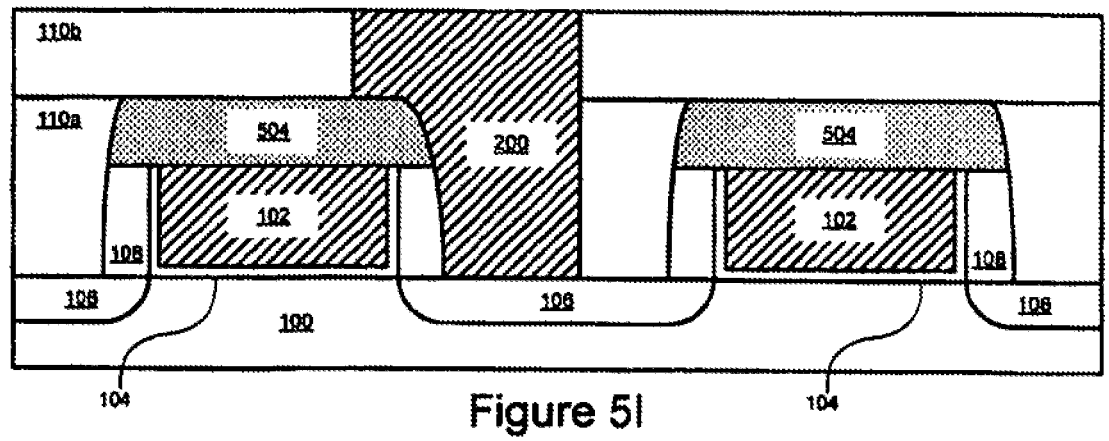

FIG. 5I illustrates a trench contact 200 that is misaligned. As shown, even though the trench contact 200 is situated on top of the metal gate electrode 102, the insulating-cap layer 504 protects the metal gate electrode 102 and prevents a CTG short from forming by electrically isolating the metal gate electrode 102 from the misaligned trench contact 200.

Another advantage provided by the insulating-cap layer 504 addresses the parasitic capacitance issue discussed above in relation to FIG. 1A. Parasitic capacitance issues are caused by the relatively tight spacing between the trench contact 200 and the diffusion region 106 on one side and the gate electrode 102 on the other side. The spacers 108 tend to provide the bulk of the separation between the trench contact 200/diffusion region 106 and the gate electrodes 102, but conventional spacer materials, such as silicon nitride, do little to reduce this parasitic capacitance. Nevertheless, silicon nitride is still used because the etching process that creates a contact trench opening for the trench contact 200 is selective to silicon nitride.

In accordance with this implementation of the invention, materials other than silicon nitride may be used in the spacers 108. Here, the laterally extending insulating-cap layer 504 protects the underlying spacers 108 during etching processes used to fabricate the trench contact 200. These etching processes are generally anisotropic processes, therefore, the etch chemistry need only be selective to the insulating-cap layer 504. The insulating-cap layer 504 can then shield the underlying spacers 108. So with an anisotropic process, the use of the insulating-cap layer 504 means the etch chemistry does not necessarily need to be selective to the material used in the spacers 108. This removes any constraints on the choice of spacer material and enables the use of materials that are optimized for capacitance. For instance, materials such as silicon oxynitride (SiON), carbon-doped silicon oxynitride (SiOCN), or low-k dielectric materials may be used in the spacers 108 to reduce issues with parasitic capacitance.

Figure 6A:
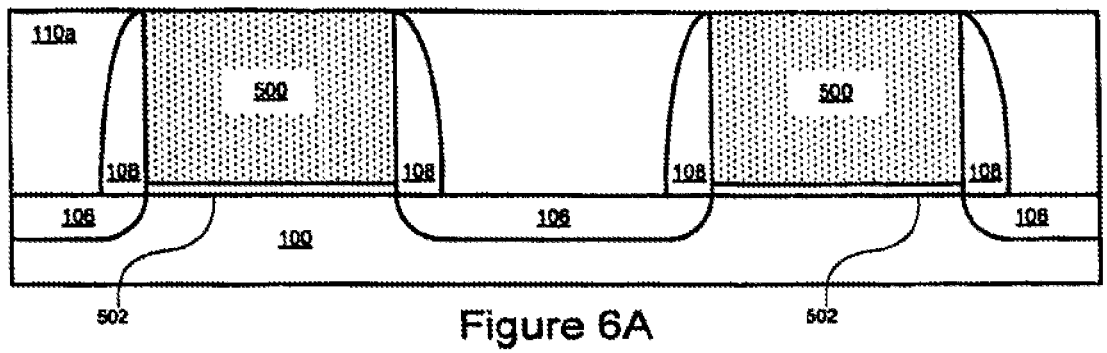
FIGS. 6A to 6F illustrate a fabrication process for a metal gate electrode having a stepped profile, in accordance with an implementation of the invention.
Figure 6B:
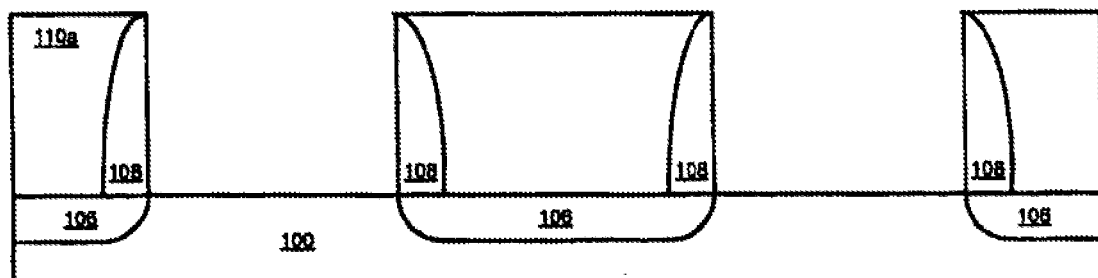

FIGS. 6A to 6F illustrate the formation of a stepped metal gate electrode in conjunction with an insulating-cap layer in accordance with an implementation of the invention. Initially, FIG. 6A illustrates two MOS transistors that include a dummy gate electrode 500 and a dummy gate dielectric layer 502. Moving to FIG. 6B, one or more etching processes are carried out to completely remove the dummy gate electrode 500 as well as the dummy gate dielectric 502. Etching processes to completely remove the dummy gate electrode 500 and dummy gate dielectric are well known in the art. The dummy gate electrode 500 and dummy gate dielectric 502 are removed in their entirety, thereby exposing the top of the substrate 100.

Figure 6C:
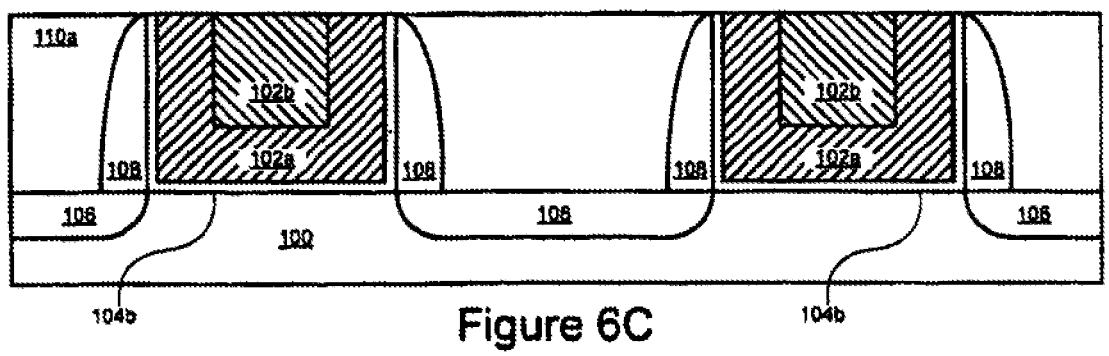

FIG. 6C illustrates the deposition of dual metal gate electrode layers, a conformal metal gate electrode layer 102a and a second metal layer 102b that may or may not be conformal. The initial metal gate electrode layer 102a may be deposited using a conformal deposition process such as chemical vapor deposition or atomic layer deposition. Other processes, such as physical vapor deposition or sputtering, may also be used. The second metal gate electrode 102b is deposited using a conventional deposition process such as chemical vapor deposition, atomic layer deposition, physical vapor deposition, sputtering, or even processes such as electroplating or electroless plating since a conformal layer is not needed for layer 102b.

The initial metal gate electrode layer 102a is typically a workfunction metal layer and can be formed using any of the workfunction metals described above. The second metal gate electrode layer 102b may be a second workfunction metal layer or it may be a low resistance fill metal layer such as aluminum, tungsten, or copper. In accordance with implementations of the invention, the metal used in the metal gate electrode 102a has different etch properties than the metal used in the metal gate electrode 102b.

Figure 6D:
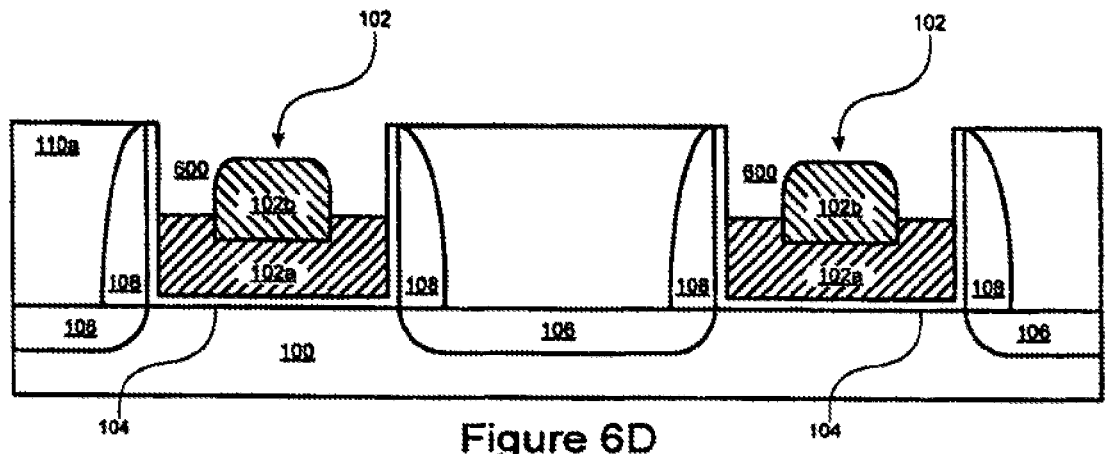

Moving to FIG. 6D, the dual metal gate electrode layers 102a and 102b are etched and recessed to form trenches 600 in which insulating cap layers may be fabricated. In accordance with an implementation of the invention, the etching process removes a larger portion of metal layer 102a than metal layer 102b. This yields a stepped or bulleted profile for the metal gate electrode 102, as shown in FIG. 6D. A middle portion of the overall metal gate electrode 102 is relatively thicker than the outer edge portions of the overall metal gate electrode 102. Stated differently, a middle portion of the metal gate electrode 102 has a relatively larger height than side portions of the metal gate electrode 102. This stepped profile for the metal gate electrode 102 provides advantages as explained below in FIG. 6F.

In one implementation, a single etching process is used that etches the metal gate electrode layer 102a at a faster rate than the metal gate electrode layer 102b. In other words, the etch chemistry is more selective to the metal gate electrode 102b. In another implementation, two etching processes may be used, one for metal layer 102a and another for metal layer 102b. If two etching processes are used, a larger portion of metal layer 102a must be removed relative to metal layer 102b. Thus in one implementation, the first of the two etching processes may be selective to the metal layer 102b and the second of the two etching processes may be selective to the metal layer 102a. The etching processes used may be wet etch, dry etch, or a combination of both. It will be appreciated by those of ordinary skill in the art that for almost any arbitrary pair of metals used in metal layers 102a and 102b, it is possible to find a wet or dry chemical etch that will differentiate between the two metals.

Figure 6E:
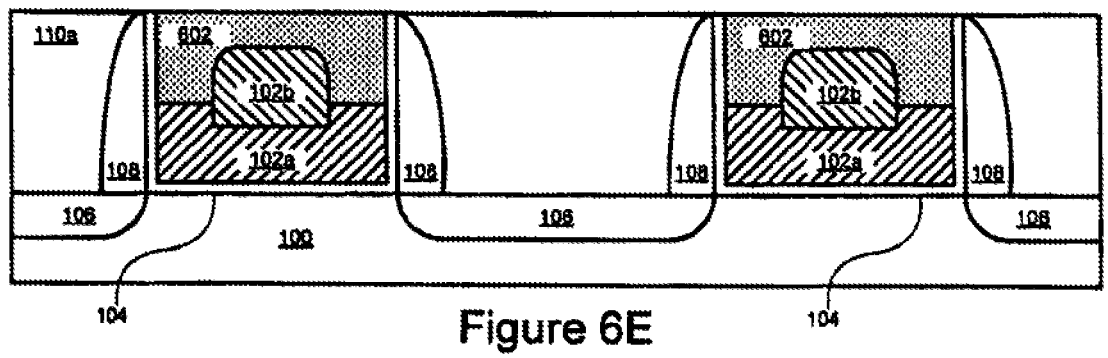

As shown in FIG. 6E, an insulator material deposition process fills the trenches 600 and a polishing process is used to polish down the insulator material layer and substantially remove any insulator material that is outside of the trench 600. This yields an insulator-cap layer 602 that is substantially contained within the trench 600. The insulator-cap layer 602 is relatively thick at its outer edges and relatively thin at its middle portion due to the stepped profile of the metal gate electrode 102. The insulator-cap layer 602 may be formed of materials that include, but are not limited to, silicon nitride, silicon oxide, silicon carbide, silicon nitride doped with carbon, silicon oxynitride, other nitride materials, other carbide materials, aluminum oxide, other oxide materials, other metal oxides, and low-k dielectric materials.

Figure 6F:
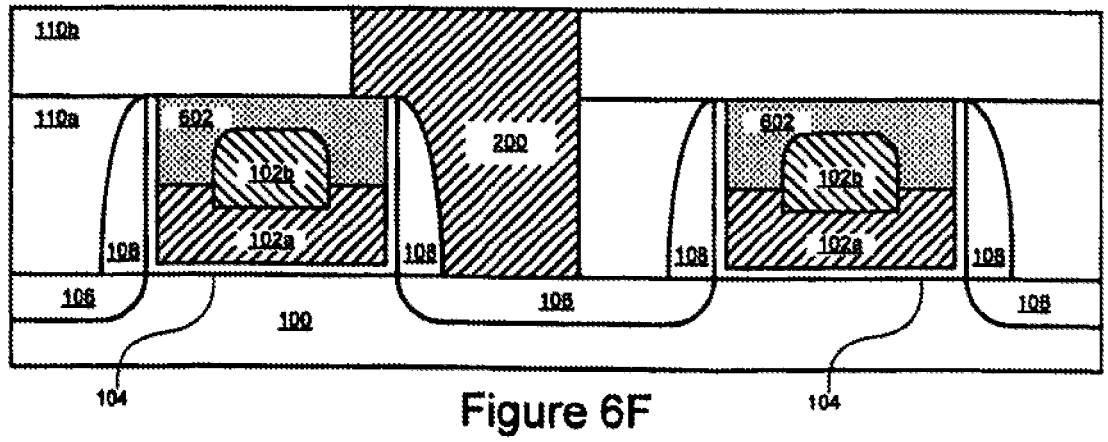

FIG. 6F illustrates a trench contact 200 that is misaligned. As shown, even though the trench contact 200 is situated on top of the metal gate electrode 102, the insulating-cap layer 602 protects the metal gate electrode 102 and prevents a CTG short from forming by electrically isolating the metal gate electrode 102 from the misaligned trench contact 200. The stepped profile of the metal gate electrode 102 provides at least two advantages. First, the stepped profile causes the thick portion of the insulator-cap layer 602 to be positioned between the metal gate electrode 102 and the trench contact 200, thereby providing strong electrical isolation. Second, the stepped profile allows the middle portion of the metal gate electrode 102 to remain thick, thereby lowering the electrical resistance of the metal gate electrode 102 by increasing its metal content. In various implementations of the invention, the stepped profile may be optimized by trying to maximize the volume or width of the middle portion of the metal gate electrode 102 while maintaining its electrical isolation from misaligned trench contact 200. In some implementations, this may be done by increasing the size or thickness of the metal gate electrode 102b. In further implementations, this may be done by using more than two metal gate electrode layers to more finely tailor the stepped profile.

Figure 7A:
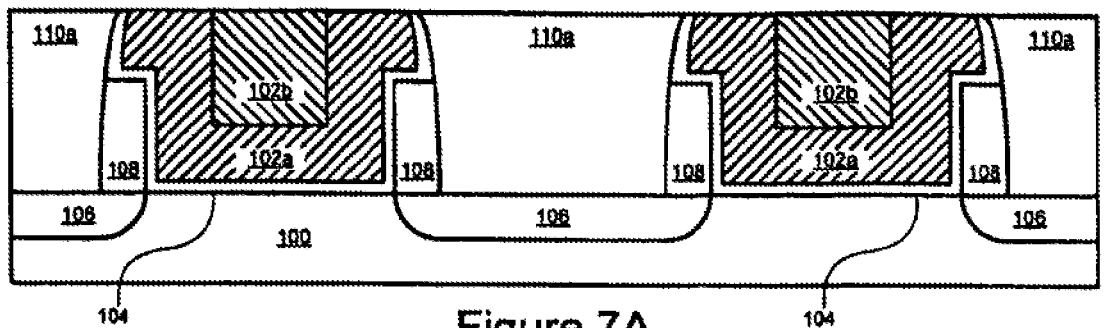
FIGS. 7A to 7C illustrate MOS transistors having both metal gate electrodes with stepped profiles and insulator-cap layers that extend over the spacers, in accordance with an implementation of the invention.
Figure 7B:
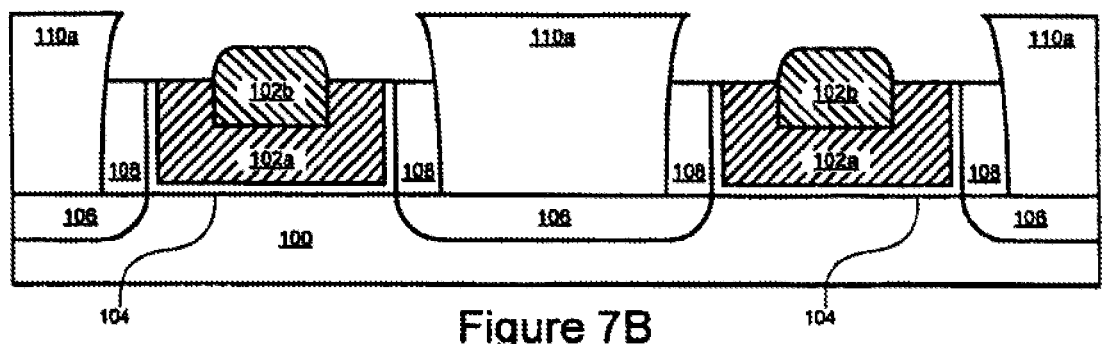
Figure 7C:
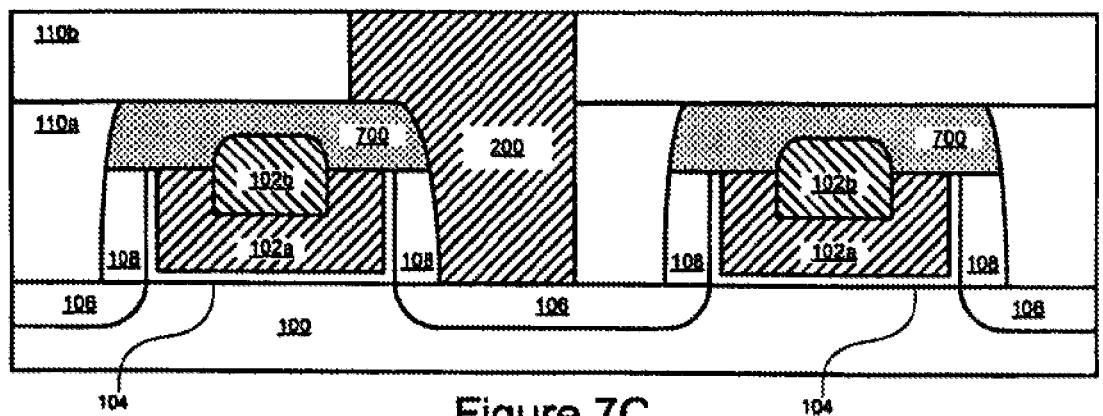

In accordance with another implementation of the invention, FIGS. 7A to 7C illustrate the fabrication of a MOS transistor that combines the wide insulator-cap layer 504 of FIG. 5F with the stepped profile metal gate electrode 102 of FIGS. 6D to 6F. Starting with the structure shown in FIG. 5C, dual metal gate electrode layers are deposited as shown in FIG. 7A. One layer is a conformal metal gate electrode layer 102a and the other layer is a second metal layer 102b that may or may not be conformal. The initial metal gate electrode layer 102a is typically a workfunction metal layer and the second metal gate electrode layer 102b may be a second workfunction metal layer or it may be a fill metal layer. In accordance with implementations of the invention, the metal used in the metal gate electrode 102a has different etch properties than the metal used in the metal gate electrode 102b.

Moving to FIG. 7B, the dual metal gate electrode layers 102a and 102b, as well as the gate dielectric layer 104, are etched and recessed. The etch process is selective to the metal gate electrode 102b. This yields a stepped profile for the metal gate electrode 102, as shown in FIG. 7B. A middle portion of the overall metal gate electrode 102 is relatively thicker than the outer edge portions of the overall metal gate electrode 102.

An insulating material is then deposited and planarized to form insulator-cap layers 700 atop each metal gate electrode 102. This is shown in FIG. 7C. Also shown is a misaligned trench contact 200. The stepped profile of the metal gate electrode 102 allows the thick portion of the insulator-cap layer 700 to electrically isolate the metal gate electrode 102 from the trench contact 200. The stepped profile also allows a middle portion of the metal gate electrode 102 to remain thick, thereby reducing electrical resistance. In this implementation, the insulating-cap layer 700 extends over the recessed spacers 108, thereby protecting the spacers during the trench contact 200 etch process and allowing a material to be used in the spacers 108 that is optimized for reducing parasitic capacitance between the trench contact 200 and the metal gate electrode 102.

Figure 8A:
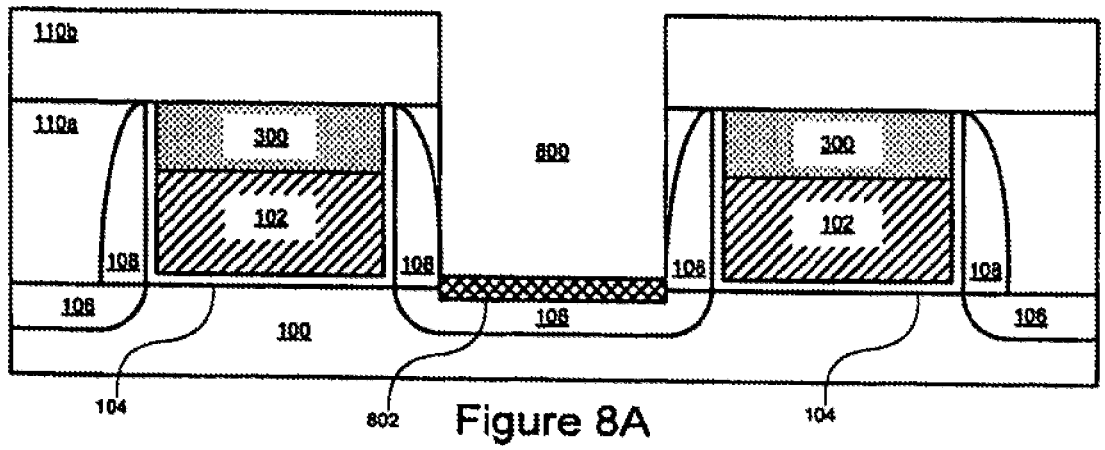
FIG. 8A to 8F illustrate contact sidewall spacers in accordance with an implementation of the invention.

FIGS. 8A to 8F illustrate another implementation of the invention in which contact sidewall spacers are used to reduce CTG shorts and to improve parasitic capacitance issues. FIG. 8A illustrates a contact trench opening 800 that has been etched through ILD layers 110a and 110b down to the diffusion region 106. As explained above, photolithography patterning and etching processes are used to form the contact trench opening 800.

Also shown in FIG. 8A is a silicide layer 802 that has been formed at the bottom of the contact trench opening 800. To fabricate the silicide layer 802, a conventional metal deposition process, such as a sputtering deposition process or an ALD process, may be used to form a conformal metal layer along at least the bottom of the contact trench opening 800. Often the metal will deposit on the sidewalls of the contact trench opening 800 as well. The metal may include one or more of nickel, cobalt, tantalum, titanium, tungsten, platinum, palladium, aluminum, yttrium, erbium, ytterbium, or any other metal that is a good candidate for a silicide. An annealing process may then be carried out to cause the metal to react with the diffusion region 106 and form a silicide layer 802. Any unreacted metal may be selectively removed using known processes. The silicide layer 802 reduces the electrical resistance between the later formed trench contact 200 and the diffusion region 106.

Figure 8B:
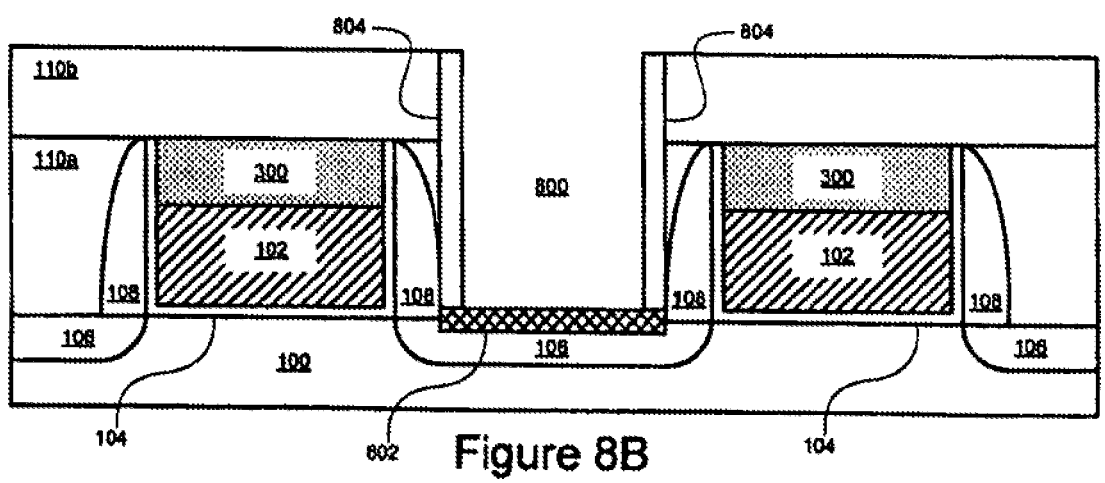

FIG. 8B illustrates a pair of contact sidewall spacers 804 that are formed along the sidewalls of the contact trench opening 800, in accordance with an implementation of the invention. The contact sidewall spacers 804 may be formed using deposition and etching processes similar to the fabrication of gate spacers 108. For instance, a conformal layer of an insulating material may be deposited within the contact trench opening 800, resulting in the insulating material being deposited along the sidewalls and bottom surface of the contact trench opening 800. The insulating material may be silicon oxide, silicon nitride, silicon oxynitride (SiON), carbon-doped silicon oxynitride (SiOCN), any other oxide, any other nitride, or any low-k dielectric material. Next, an anisotropic etching process is used to remove the insulating material from the bottom of the contact trench opening 800, as well as from other areas such as the surface of the ILD layer 110b. This yields the contact sidewall spacers 804 that are shown in FIG. 8B.

As will be appreciated by those of skill in the art, a separate patterning process may be used to form vias down to the metal gate electrodes 102 in order to form gate contacts. This separate patterning process will typically involve coating the wafer with a sacrificial photo-definable resist layer, etching the gate contacts, and then removing the photoresist with a wet or dry cleaning process or some combination thereof. This separate patterning process is generally carried out after the contact trench opening 800 has been formed, which means first the resist coating and then the wet or dry clean chemistry enters the contact trench opening 800 and can degrade the silicide layer 802. Therefore, in accordance with an implementation of the invention, the conformal layer of insulating material used to form the spacers 804 is deposited before the patterning process for the gate contacts. The conformal layer remains in place to protect the silicide layer 802 until after the gate contacts have been patterned. Then the anisotropic etch described above may be carried out to etch the conformal layer and form the spacers 804.

It should be noted that the silicide layer 802 is formed prior to fabrication of the contact sidewall spacers 804, which is when the contact trench opening 800 is at its largest width. By forming the silicide layer 802 before forming the contact sidewall spacers 804, a relatively wider silicide layer 802 can be formed to provide better electrical resistance properties, such as lower intrinsic contact resistance. If the contact sidewall spacers 804 are formed first, then less of the diffusion region 106 would be exposed for the silicide fabrication process, yielding a relatively shorter silicide layer.

Figure 8C:
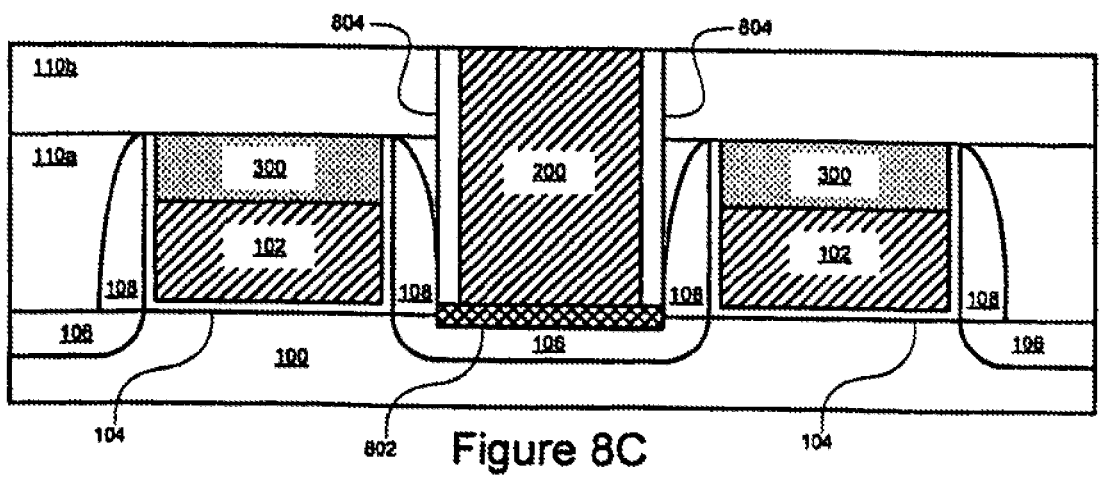

A metal deposition process is then carried out to fill the contact trench opening 800 and form the trench contact 200, as shown in FIG. 8C. As noted above, the metal deposition process can be any metal deposition process, such as electroplating, electroless plating, chemical vapor deposition, physical vapor deposition, sputtering, or atomic layer deposition. The metal used may be any metal that provides suitable contact properties, such as tungsten or copper. A metal liner is often deposited prior to the metal, such as a tantalum or tantulum nitride liner. A CMP process is used to remove any excess metal and complete the fabrication of the trench contact 200.

The contact sidewall spacers 804 provide an additional layer of protection between the gate electrodes 102 and the trench contact 200. The final trench contact 200 has a relatively narrower width than trench contacts 200 formed using conventional processes, thereby reducing the likelihood of CTG shorts. And the additional layer of insulation between the gate electrodes 102 and the trench contact 200 reduces parasitic capacitance.

Figure 8D:
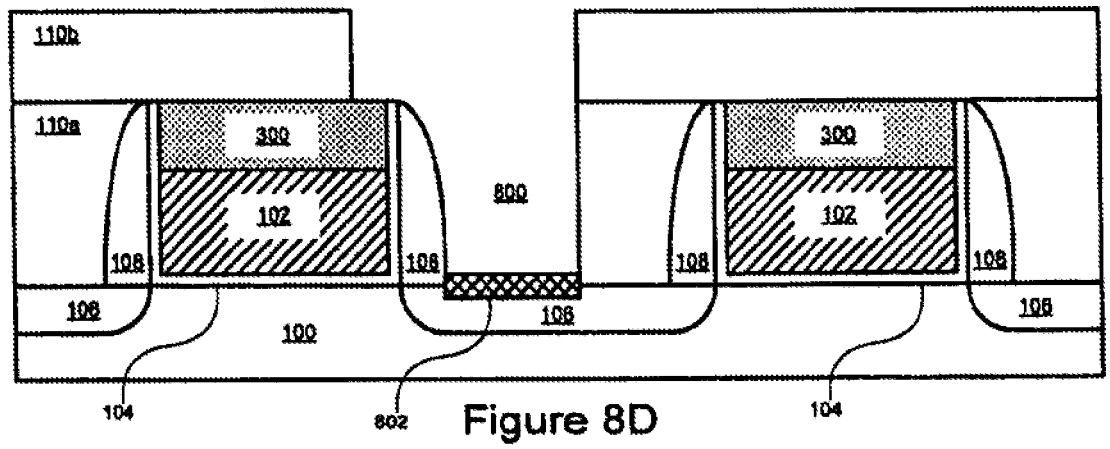
Figure 8E:
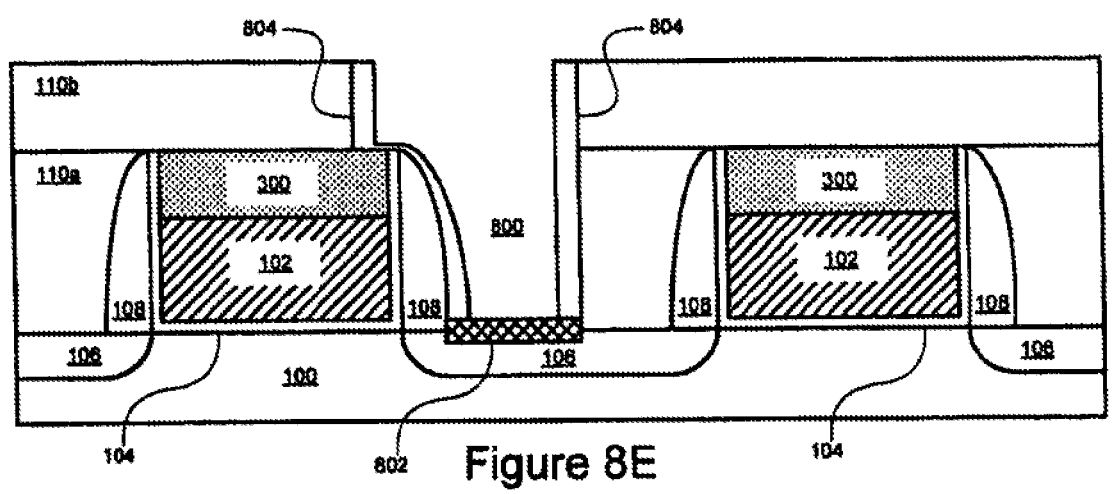
Figure 8F:
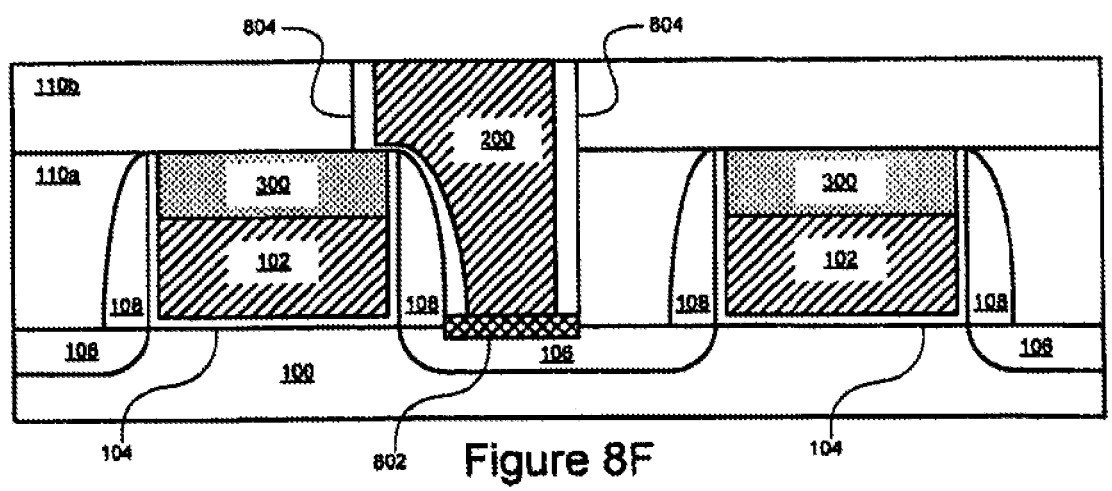

FIGS. 8D to 8F illustrate the fabrication of contact sidewall spacers 804 when the contact is misaligned. FIG. 8D illustrates a misaligned contact trench opening 800 that has been etched through ILD layers 110a and 110b down to the diffusion region 106. The insulating-cap layer 300 protects the metal gate electrode 102 from being exposed during this etching process, in accordance with an implementation of the invention. Also shown in FIG. 8D is a silicide layer 802 that has been formed at the bottom of the contact trench opening 800. Fabrication processes for the silicide layer 802 were provided above.

FIG. 8E illustrates a pair of contact sidewall spacers 804 that are formed along the sidewalls of the contact trench opening 800, in accordance with an implementation of the invention. The contact sidewall spacers 804 may be formed by depositing and etching a conformal layer of an insulating material, as explained above.

A metal deposition process is then carried out to fill the contact trench opening 800 and form the trench contact 200, as shown in FIG. 8F. Here again, the contact sidewall spacers 804 provide an additional layer of protection between the gate electrodes 102 and the trench contact 200. The contact sidewall spacers 804 provide more separation between the final trench contact 200 and the metal gate electrodes 102, thereby reducing the likelihood of CTG shorts. And the additional layer of insulation between the gate electrodes 102 and the trench contact 200 reduces parasitic capacitance.

Figure 9A:
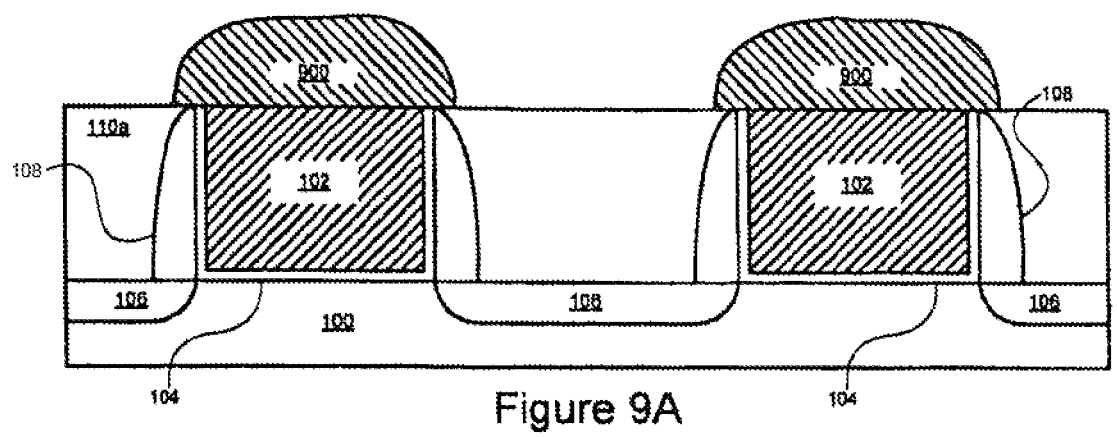
FIGS. 9A to 9D illustrate a fabrication process to form an insulating-cap atop a metal gate electrode in accordance with an implementation of the invention.

FIGS. 9A to 9D illustrate another process for forming an insulating-cap layer in accordance with an implementation of the invention. FIG. 9A illustrates two MOS transistors having metal gate electrodes 102 and gate dielectric layer 104. The gate electrode layer 102 may include two or more layers (not illustrated), such as a workfunction metal layer and a fill metal layer. Although the gate dielectric layer 104 shown corresponds to a replacement-metal gate process, the following process may also be used with transistors formed using a gate-first approach.

A metal-cap 900 is formed atop the metal gate electrode 102, as shown in FIG. 9A. In accordance with implementations of the invention, the metal-cap 900 is formed using a selective deposition process. Some selective deposition processes include, but are not limited to, electroless plating and chemical vapor deposition. Metals that may be selectively deposited include, but are not limited to, cobalt, nickel, platinum, copper, polysilicon, tungsten, palladium, silver, gold, and other noble metals. As will be appreciated by those of skill in the art, the choice of whether an electroless process or a CVD process is used will depend on the composition of the metal gate electrode 102 and the specific metal that is used in the metal-cap 900. In one example, if the top portion of the metal gate electrode 102 consists of copper metal, then cobalt metal can be electrolessly deposited on the copper. In another example, tungsten or polysilicon can be deposited by CVD on almost any metal that is used in the metal gate electrode 102. In another example, if the top portion of the metal gate electrode 102 consists of a noble metal, then most metals may be deposited using an electroless process on the noble metal. As will be appreciated by those of ordinary skill in the art, in general, electroless processes require a noble metal for both the substrate metal and the metal to be deposited. Therefore combinations of metals such as cobalt, nickel, copper, platinum, palladium, gold, and silver are possible.

Figure 9B:
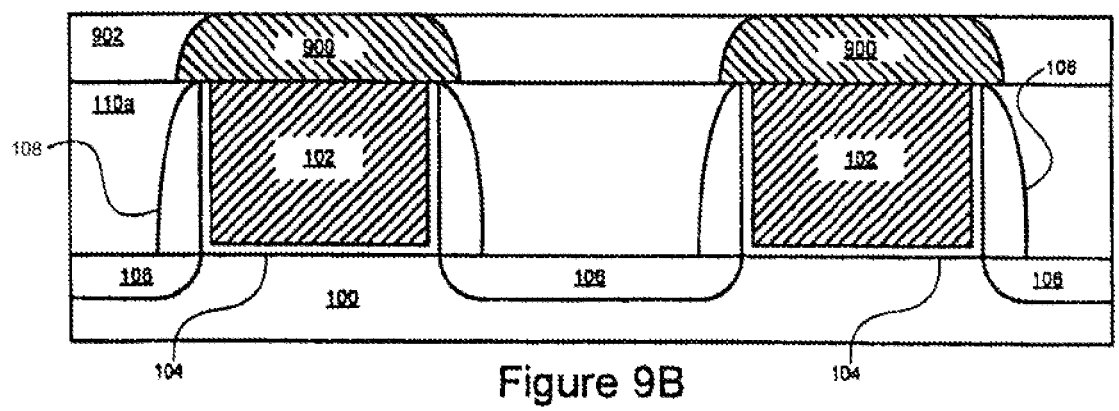

Moving to FIG. 9B, an ILD layer 902 is blanket deposited over the ILD 110a and the metal-caps 900. A CMP process is then used to planaraize both the ILD layer 902 and the metal-caps 900 and cause their top surfaces to be substantially even. This is done to expose the top surface of the metal-caps 900 after the ILD deposition.

Figure 9C:
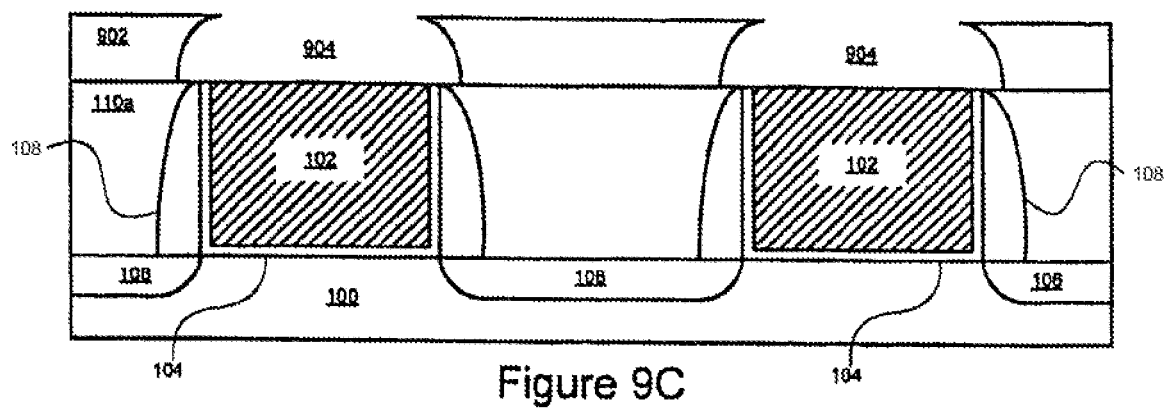

Next, as shown in FIG. 9C, an etching process is used to remove the metal-caps 900 from within the ILD layer 902. In one implementation, a wet etch chemistry may be applied to remove the metal-caps 900. In accordance with implementations of the invention, the etch chemistry that is used must be selective to both the ILD layer 902 and the metal gate electrode 102. This enables the metal-caps 900 to be removed with minimal impact to the ILD layer 902 and the metal gate electrode 102. The removal of the metal-caps 900 yields voids 904 within the ILD layer 902.

Figure 9D:
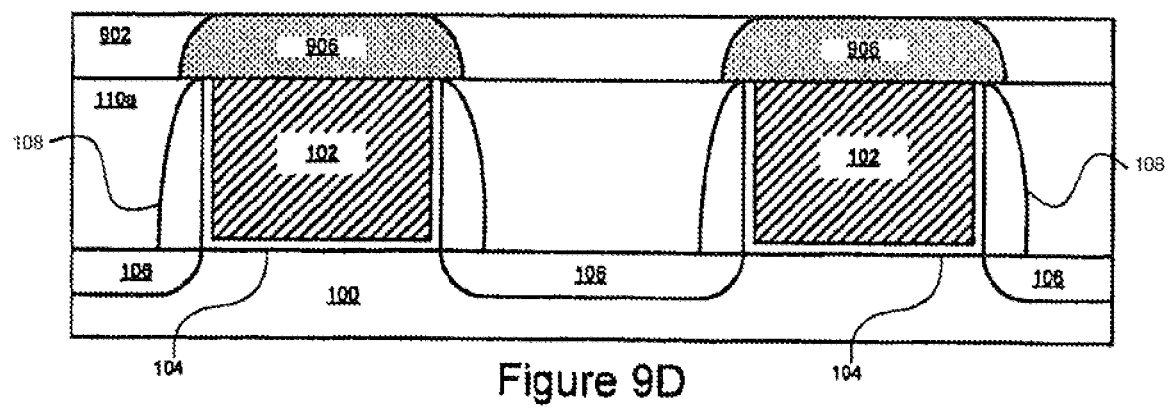

Moving to FIG. 9D, an insulating layer, such as a silicon nitride layer, may be deposited and planarized to fill in the voids 904, thereby forming self-aligned insulating-cap layers 906. This insulating layer is generally deposited as a blanket layer that fills the voids 904 and covers the ILD layer 902. A planarization process is then used to remove any excess material that is outside of the voids 904. This confines the insulating material to the voids 904, thereby forming insulating-cap layers 906. The insulator-cap layers 906 may be formed of materials that include, but are not limited to, silicon nitride, silicon oxide, silicon carbide, silicon nitride doped with carbon, silicon oxynitride, other nitride materials, other carbide materials, aluminum oxide, other oxide materials, other metal oxides, and low-k dielectric materials. The only constraint is that the material used in the insulator-cap layers 906 be dissimilar to the material used in the ILD layer 902.

Figure 10A:
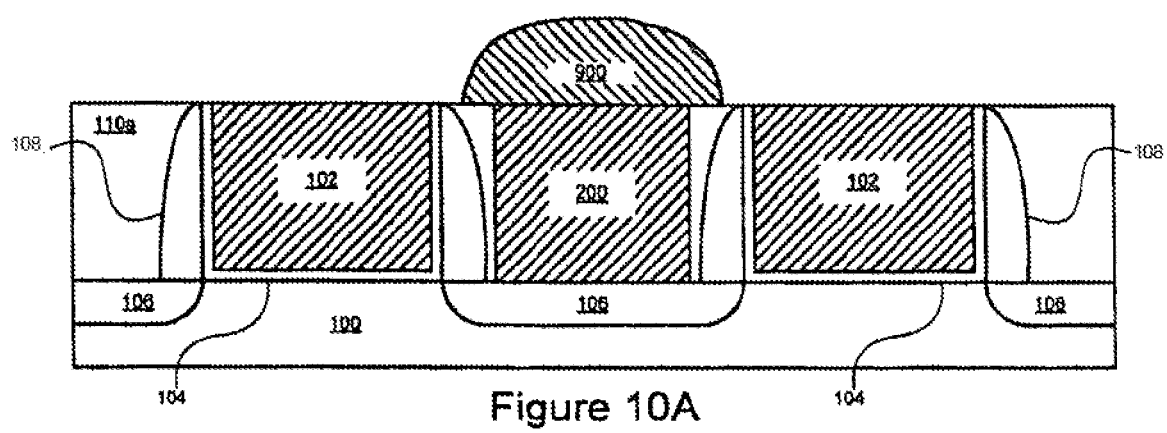
FIGS. 10A to 10G illustrate a fabrication process to form a metal stud and insulating spacers atop a trench contact in accordance with an implementation of the invention.

FIGS. 10A to 10G illustrate a process for forming a self-aligned metal stud atop the trench contact 200 and a pair of insulating spacers that further insulate the metal stud from the metal gate electrodes 102, in accordance with an implementation of the invention. FIG. 10A illustrates two MOS transistors having metal gate electrodes 102 and gate dielectric layer 104. A trench contact 200 is formed between the two MOS transistors.

A metal-cap 900 is formed atop the trench contact 200, as shown in FIG. 10A. In accordance with implementations of the invention, the metal-cap 900 is formed using a selective deposition process. As noted above, selective deposition processes include, but are not limited to, electroless plating and chemical vapor deposition. The same metals and processes described above for use with the metal gate electrode 102 may also be used here with the trench contact 200. The selective deposition process used and the metal used in the metal-cap 900 will depend on the metal that is used in the trench contact 200.

In accordance with implementations of the invention, a selective deposition process is chosen that will deposit metal on only the trench contact 200 and not on the metal gate electrode 102. This can be accomplished by using different types of metals in the trench contact 200 and the metal gate electrode 102. For example, if aluminum is used in the metal gate electrode 102 and a noble metal is used in the trench contact 200, then a selective deposition process can be used to deposit the metal-cap 900 on only the noble metal in the trench contact 200. The same combinations of noble metals described above will work here as well. In some implementations of the invention, when an active metal such as aluminum, tungsten, molybdenum, titanium, tantalum, titanium nitride, or polysilicon is used in the metal gate electrode 102, then a noble metal such as cobalt, nickel, copper, platinum, palladium, gold, and silver may be used in the trench contact 200.

Figure 10B:
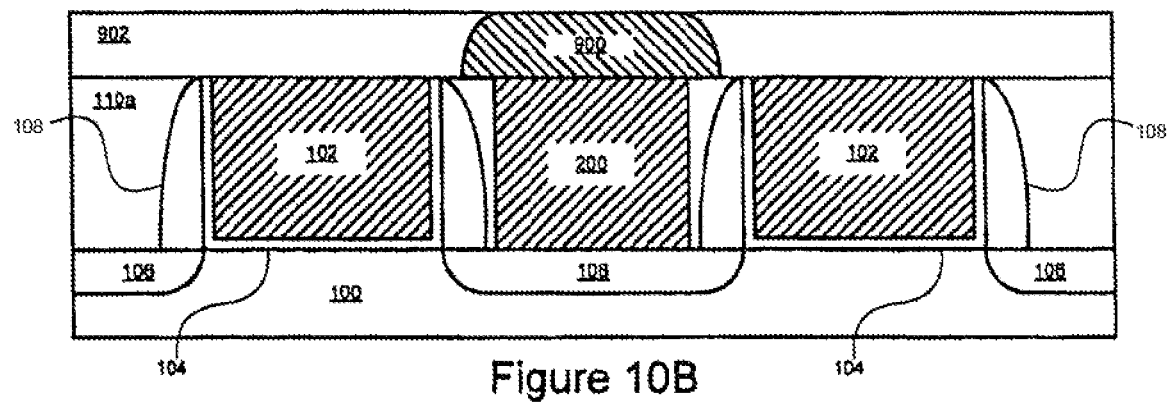

Moving to FIG. 10B, an ILD layer 902 is blanket deposited over the ILD 110a and the metal-cap 900. A CMP process is then used to planaraize both the ILD layer 902 and the metal-cap 900 and cause their top surfaces to be substantially even. This is done to expose the top surface of the metal-cap 900 after the ILD deposition.

Figure 10C:
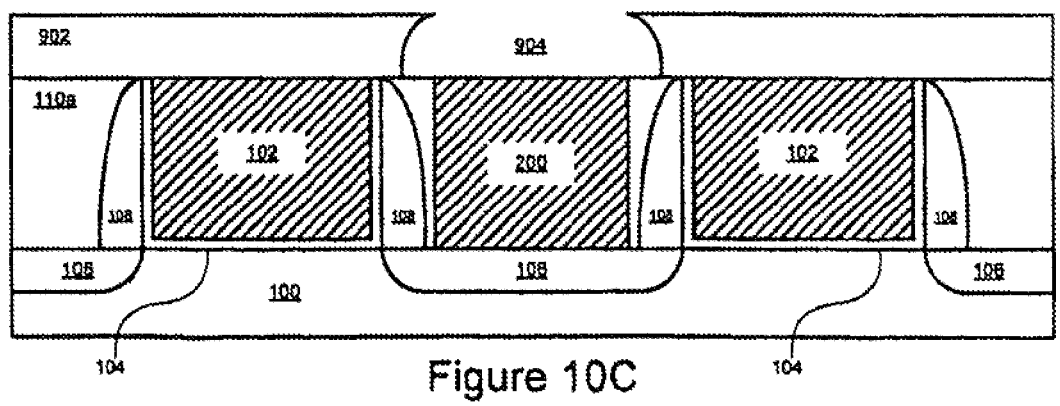

Next, as shown in FIG. 10C, an etching process is used to remove just the metal-cap 900 from within the ILD layer 902. The etch chemistry that is used must be selective to both the ILD layer 902 and the trench contact 200. This enables the metal-cap 900 to be removed with minimal impact to the ILD layer 902 and the trench contact 200. The removal of the metal-cap 900 yields a void 904 within the ILD layer 902.

Figure 10D:
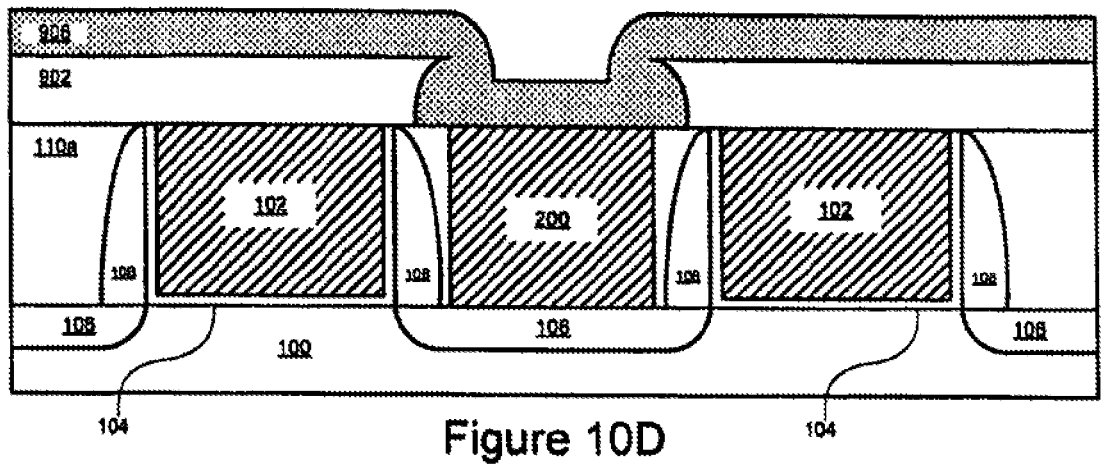

Moving to FIG. 10D, an insulating layer 906 may be blanket deposited over the ILD layer 902 and within the void 904. The insulating layer 906 may be formed of materials that include, but are not limited to, silicon nitride, silicon oxide, silicon carbide, silicon nitride doped with carbon, silicon oxynitride, other nitride materials, other carbide materials, aluminum oxide, other oxide materials, other metal oxides, and low-k dielectric materials, including materials that are the same or similar to the material used in the ILD layer 902.

Figure 10E:
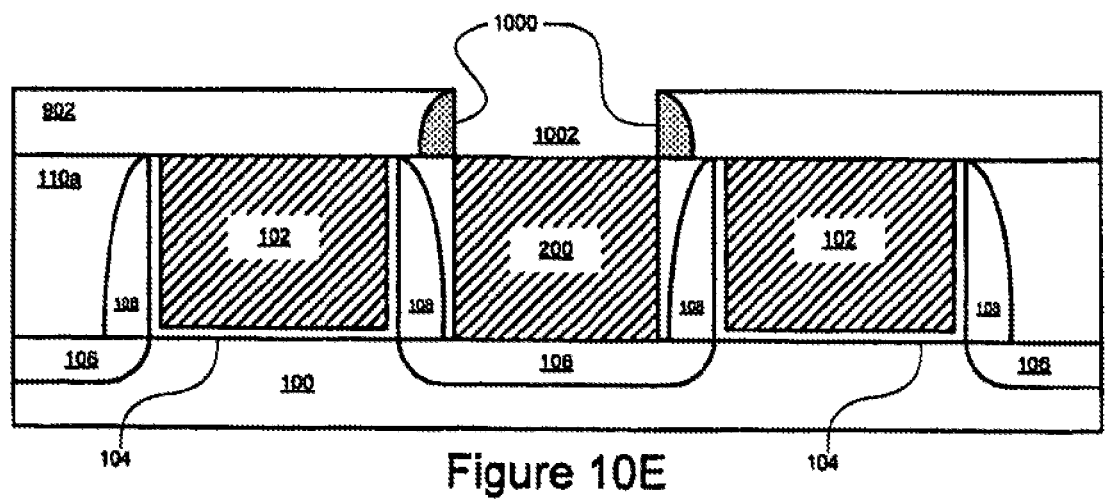

Next, an etching process, such as an anisotropic etching process is applied to etch down the insulating layer 906 and form spacers 1000. This is shown in FIG. 10E. The etching process also creates a trench 1002 between the two spacers 1000.

Figure 10F:
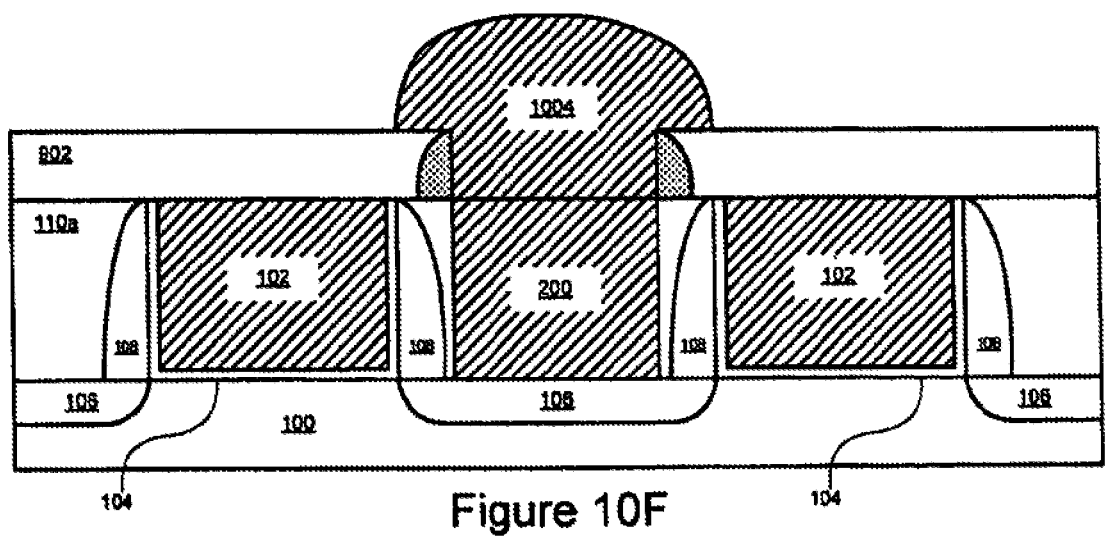
Figure 10G:
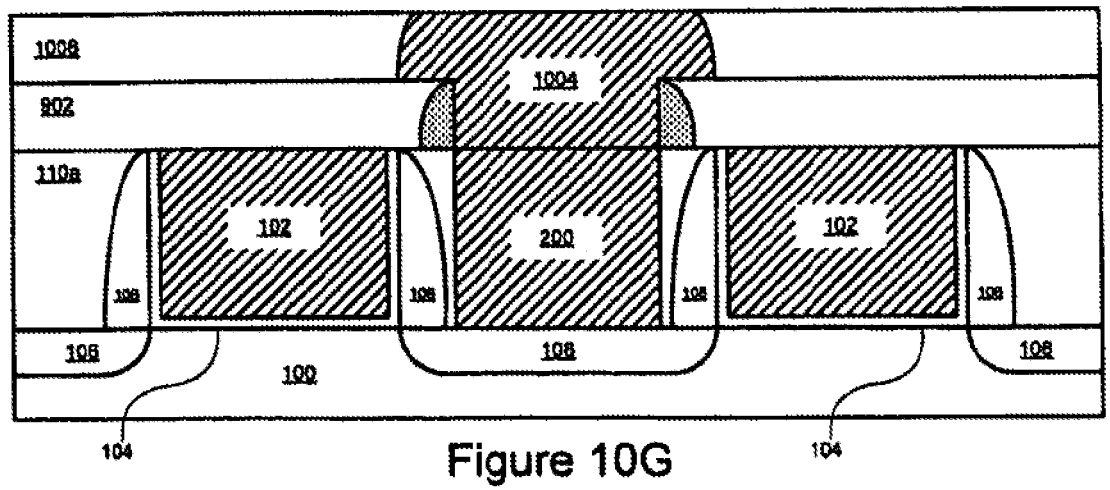

Moving to FIG. 10F, a metal deposition process is used to deposit a self-aligned metal stud 1004 in the trench 1002 between the spacers 1000 and atop the trench contact 200. In some implementations this metal deposition process may be another selective deposition process, while in other implementations this metal deposition process need not be a selective process. Finally, as shown in FIG. 10G, an insulating layer may be deposited and planarized to form an ILD layer 1006. The top of the metal stud 1004 is also planarized to be even with the ILD layer 1006. In accordance with implementations of the invention, the self aligned metal stud 1004 is prevented from shorting to the gate by the spacers 1000.

Thus, implementations of the invention are described here that form etch stop structures that are self aligned to the gate, preventing the contact etch from exposing the gate electrode to cause shorting between the gate and contact. A contact to gate short is prevented even in the case of the contact pattern overlaying the gate electrode. Implementations of the invention also address problems such as parasitic capacitance between trench contacts and gate electrodes, dielectric breakdown or direct shorts from contact to gate, and degradation of contact silicide during gate contact patterning.

Accordingly, the use of an insulator-cap layer enables self-aligned contacts, which offer a robust manufacturable process. The invention allows initial patterning of wider contacts which is more robust to patterning limitations. The wider contacts are also desirable for a silicide-through-contact process flow. Not only does this eliminate a major yield limiter in contact-to-gate shorts, but it also alleviates major constraints for contact patterning and allows for more variability. From a lithography perspective, the use of an insulator-cap layer increases the registration window and allows for more critical dimension variability. From an etch perspective, the use of an insulator-cap layer makes the fabrication process for MOS transistors more tolerant to different profiles, different critical dimensions, and over-etching of the ILD during trench contact formation.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An integrated circuit structure, comprising:
   a substrate comprising silicon;
   a first structure above the substrate, the first structure comprising a first gate dielectric and a first gate electrode, the first gate dielectric having an uppermost surface, and the first gate electrode having an uppermost surface;
   a first spacer adjacent to a first side of the first structure, the first spacer having an uppermost surface at a same level as the uppermost surface of the first gate dielectric and the uppermost surface of the first gate electrode;
   a second spacer adjacent to a second side of the first structure, the second spacer having an uppermost surface at a same level as the uppermost surface of the first gate dielectric and the uppermost surface of the first gate electrode;
   a second structure above the substrate, the second structure comprising a second gate dielectric and a second gate electrode, the second gate dielectric having an uppermost surface, and the second gate electrode having an uppermost surface;
   a third spacer adjacent to a first side of the second structure, the third spacer having an uppermost surface at a same level as the uppermost surface of the second gate dielectric and the uppermost surface of the second gate electrode;
   a fourth spacer adjacent to a second side of the second structure, the fourth spacer having an uppermost surface at a same level as the uppermost surface of the second gate dielectric and the uppermost surface of the second gate electrode;
   a source or drain region between the second spacer and the third spacer;
   a trench contact on the source or drain region;
   a first inter-layer dielectric (ILD) layer on and vertically over the uppermost surface of the first spacer, the uppermost surface of the first gate dielectric, the uppermost surface of the first gate electrode, the uppermost surface of the second spacer, the uppermost surface of the third spacer, the uppermost surface of the second gate dielectric, the uppermost surface of the second gate electrode, and the uppermost surface of the fourth spacer, wherein the first ILD layer has a first opening vertically over the source or drain region;
   a second ILD layer on the first ILD layer, wherein the second ILD layer has a second opening vertically over the first opening; and
   a metal stud on the trench contact, the metal stud separate and distinct from the trench contact.

2. The integrated circuit structure of claim 1, wherein the metal stud has a first portion in the first opening in the first ILD layer, and the metal stud has a second portion in the second opening the second ILD layer.

3. The integrated circuit structure of claim 2, wherein the second portion of the metal stud has a width greater than a width of the first portion of the metal stud.

4. The integrated circuit structure of claim 2, wherein the second portion of the metal stud has an uppermost surface at a same level as an uppermost surface of the second ILD layer.

5. The integrated circuit structure of claim 1, wherein the trench contact has an uppermost surface at a same level as an uppermost surface of the first and second structures.

6. The integrated circuit structure of claim 1, further comprising:
a dielectric material laterally between the second spacer and the trench contact.

7. The integrated circuit structure of claim 6, wherein the dielectric material is further laterally between the third spacer and the trench contact.

8. The integrated circuit structure of claim 1, wherein the integrated circuit structure is a planar integrated circuit structure.

9. An integrated circuit structure, comprising:
a substrate comprising silicon;
a first structure above the substrate, the first structure comprising a first gate dielectric and a first gate electrode;
a first spacer adjacent to a first side of the first structure;
a second spacer adjacent to a second side of the first structure;
a second structure above the substrate, the second structure comprising a second gate dielectric and a second gate electrode;
a third spacer adjacent to a first side of the second structure;
a fourth spacer adjacent to a second side of the second structure;
a source or drain region between the second spacer and the third spacer;
a trench contact on the source or drain region;
a first inter-layer dielectric (ILD) layer over and in direct contact with an uppermost surface of the first spacer, an uppermost surface of the first gate dielectric, an uppermost surface of the first gate electrode, an uppermost surface of the second spacer, an uppermost surface of the third spacer, an uppermost surface of the second gate dielectric, an uppermost surface of the second gate electrode, and an uppermost surface of the fourth spacer, wherein the first ILD layer has a first opening vertically over the source or drain region;
a second ILD layer on the first ILD layer, wherein the second ILD layer has a second opening vertically over the first opening; and
a metal stud on the trench contact, the metal stud separate and distinct from the trench contact.

10. The integrated circuit structure of claim 9, wherein the trench contact has an uppermost surface at a same level as an uppermost surface of the first and second structures.

11. The integrated circuit structure of claim 9, further comprising:
a dielectric material laterally between the second spacer and the trench contact.

12. The integrated circuit structure of claim 11, wherein the dielectric material is further laterally between the third spacer and the trench contact.

13. The integrated circuit structure of claim 9, wherein the integrated circuit structure is a planar integrated circuit structure.

14. A method of fabricating an integrated circuit structure, the method comprising:
providing a substrate comprising silicon;
forming a first structure above the substrate, the first structure comprising a first gate dielectric and a first gate electrode, the first gate dielectric having an uppermost surface, and the first gate electrode having an uppermost surface;
forming a first spacer adjacent to a first side of the first structure, the first spacer having an uppermost surface at a same level as the uppermost surface of the first gate dielectric and the uppermost surface of the first gate electrode;
forming a second spacer adjacent to a second side of the first structure, the second spacer having an uppermost surface at a same level as the uppermost surface of the first gate dielectric and the uppermost surface of the first gate electrode;
forming a second structure above the substrate, the second structure comprising a second gate dielectric and a second gate electrode, the second gate dielectric having an uppermost surface, and the second gate electrode having an uppermost surface;
forming a third spacer adjacent to a first side of the second structure, the third spacer having an uppermost surface at a same level as the uppermost surface of the second gate dielectric and the uppermost surface of the second gate electrode;
forming a fourth spacer adjacent to a second side of the second structure, the fourth spacer having an uppermost surface at a same level as the uppermost surface of the second gate dielectric and the uppermost surface of the second gate electrode;
forming a source or drain region between the second spacer and the third spacer;
forming a trench contact on the source or drain region;
forming a first inter-layer dielectric (ILD) layer on and vertically over the uppermost surface of the first spacer, the uppermost surface of the first gate dielectric, the uppermost surface of the first gate electrode, the uppermost surface of the second spacer, the uppermost surface of the third spacer, the uppermost surface of the second gate dielectric, the uppermost surface of the second gate electrode, and the uppermost surface of the fourth spacer, wherein the first ILD layer has a first opening vertically over the source or drain region;
forming a second ILD layer on the first ILD layer, wherein the second ILD layer has a second opening vertically over the first opening; and
forming a metal stud on the trench contact, the metal stud separate and distinct from the trench contact.

15. The method of claim 14, wherein the trench contact has an uppermost surface at a same level as an uppermost surface of the first and second structures.

16. The method of claim 14, wherein the integrated circuit structure is a planar integrated circuit structure.

* * * * *